US010480766B2

(12) United States Patent
Taylor et al.

(10) Patent No.: US 10,480,766 B2
(45) Date of Patent: Nov. 19, 2019

(54) EXPLOSION-PROOF ENCLOSURES INCLUDING LIGHT TRANSMISSIVE PORTIONS

(71) Applicant: Eaton Intelligent Power Limited, Dublin (IE)

(72) Inventors: Jesse Wade Taylor, Baldwinsville, NY (US); Joseph Michael Manahan, Manlius, NY (US); Andrew Francis Scarlata, West Monroe, NY (US)

(73) Assignee: Eaton Intelligent Power Limited, Dublin (IE)

( * ) Notice: Subject to any disclaimer, the term of this patent is extended or adjusted under 35 U.S.C. 154(b) by 127 days.

(21) Appl. No.: 15/621,512

(22) Filed: Jun. 13, 2017

(65) Prior Publication Data

US 2017/0356639 A1 Dec. 14, 2017

Related U.S. Application Data

(60) Provisional application No. 62/349,512, filed on Jun. 13, 2016.

(51) Int. Cl.
| | | |
|---|---|---|
| *G01D 11/30* | (2006.01) | |
| *F21V 25/12* | (2006.01) | |
| *H02B 1/28* | (2006.01) | |
| *H05K 5/04* | (2006.01) | |
| *F21Y 115/10* | (2016.01) | |

(52) U.S. Cl.
CPC ............. *F21V 25/12* (2013.01); *H02B 1/28* (2013.01); *H05K 5/04* (2013.01); *F21Y 2115/10* (2016.08)

(58) Field of Classification Search
CPC .. F21V 25/12; H02B 1/28; H05K 5/04; G06F 3/017; G08B 21/00; F16L 13/12; F01B 31/12
See application file for complete search history.

(56) References Cited

U.S. PATENT DOCUMENTS

| | | | | |
|---|---|---|---|---|
| 2007/0044652 | A1* | 3/2007 | Dunn | G01D 5/28 |
| | | | | 92/5 R |
| 2008/0136120 | A1* | 6/2008 | Babiarz | F16L 5/02 |
| | | | | 277/625 |
| 2010/0039256 | A1* | 2/2010 | Manahan | H01H 9/042 |
| | | | | 340/540 |

(Continued)

FOREIGN PATENT DOCUMENTS

WO 2016/062926 A1 4/2016

OTHER PUBLICATIONS

Article 500-516 of the National Electrical Code® with product recommendations for use in hazardous (classified) areas. https://www.crouse-hinds.de/download/1/crouse-hinds-codedigest2014.pdf (Jan. 2014).

(Continued)

*Primary Examiner* — Lisa M Caputo
*Assistant Examiner* — Nigel H Plumb
(74) *Attorney, Agent, or Firm* — Merchant & Gould P.C.

(57) ABSTRACT

Aspects and techniques of the present disclosure relate to a structure for housing an electrical component. The structure can include an explosion-proof enclosure that is rated for use in a hazardous location. The explosion-proof enclosure can include at least one flame path and at least a portion that has a plastic construction that is light transmissive for inspection purposes.

19 Claims, 14 Drawing Sheets

(56) References Cited

U.S. PATENT DOCUMENTS

| | | | | |
|---|---|---|---|---|
| 2012/0160094 A1* | 6/2012 | Manahan | ............... | B01D 46/46 95/1 |
| 2015/0077203 A1* | 3/2015 | Henderson | ........... | H01H 36/004 335/207 |
| 2015/0253857 A1* | 9/2015 | Diederichs | .............. | G06F 3/017 345/156 |

OTHER PUBLICATIONS

International Search Report and Written Opinion for Application No. PCT/US2017/037263 dated Sep. 14, 2017.

\* cited by examiner

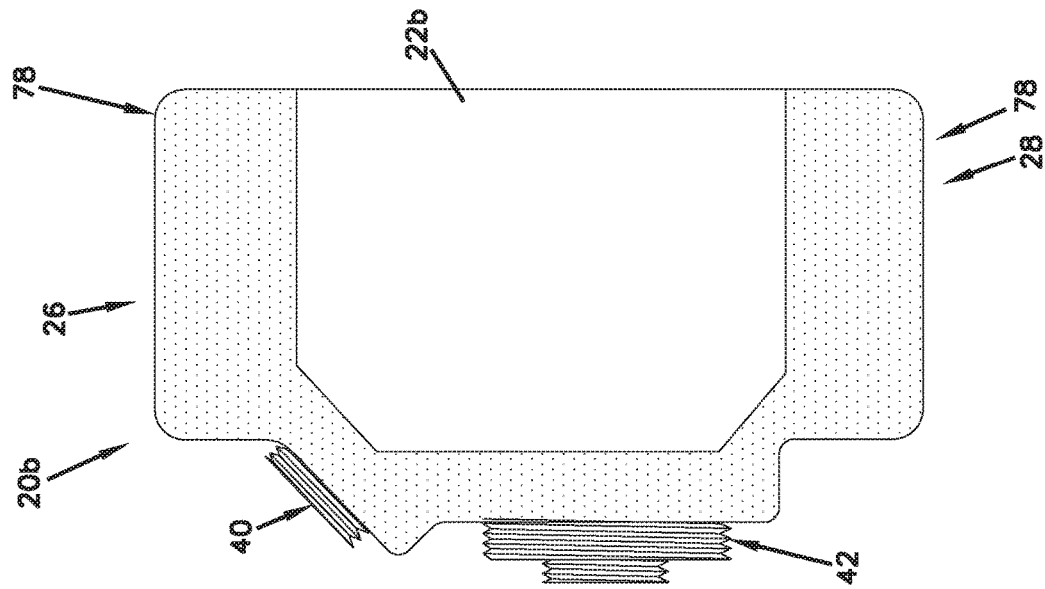
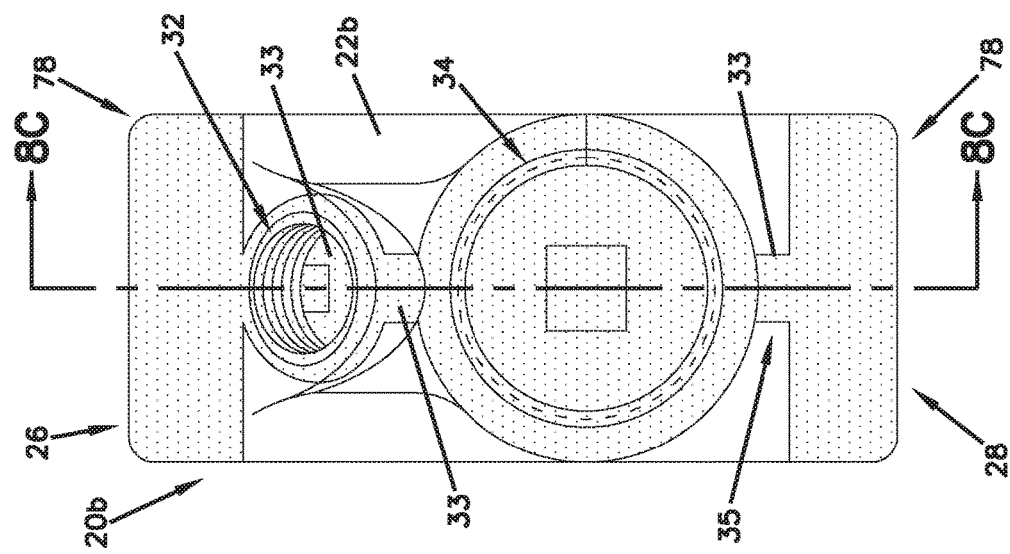

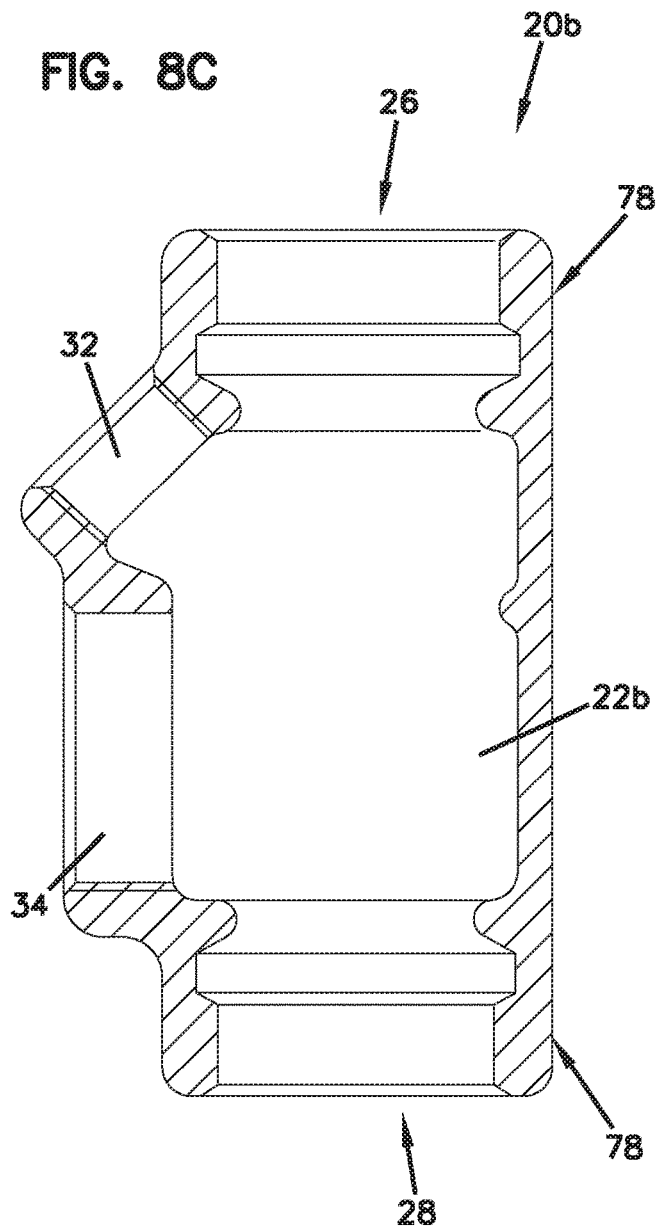

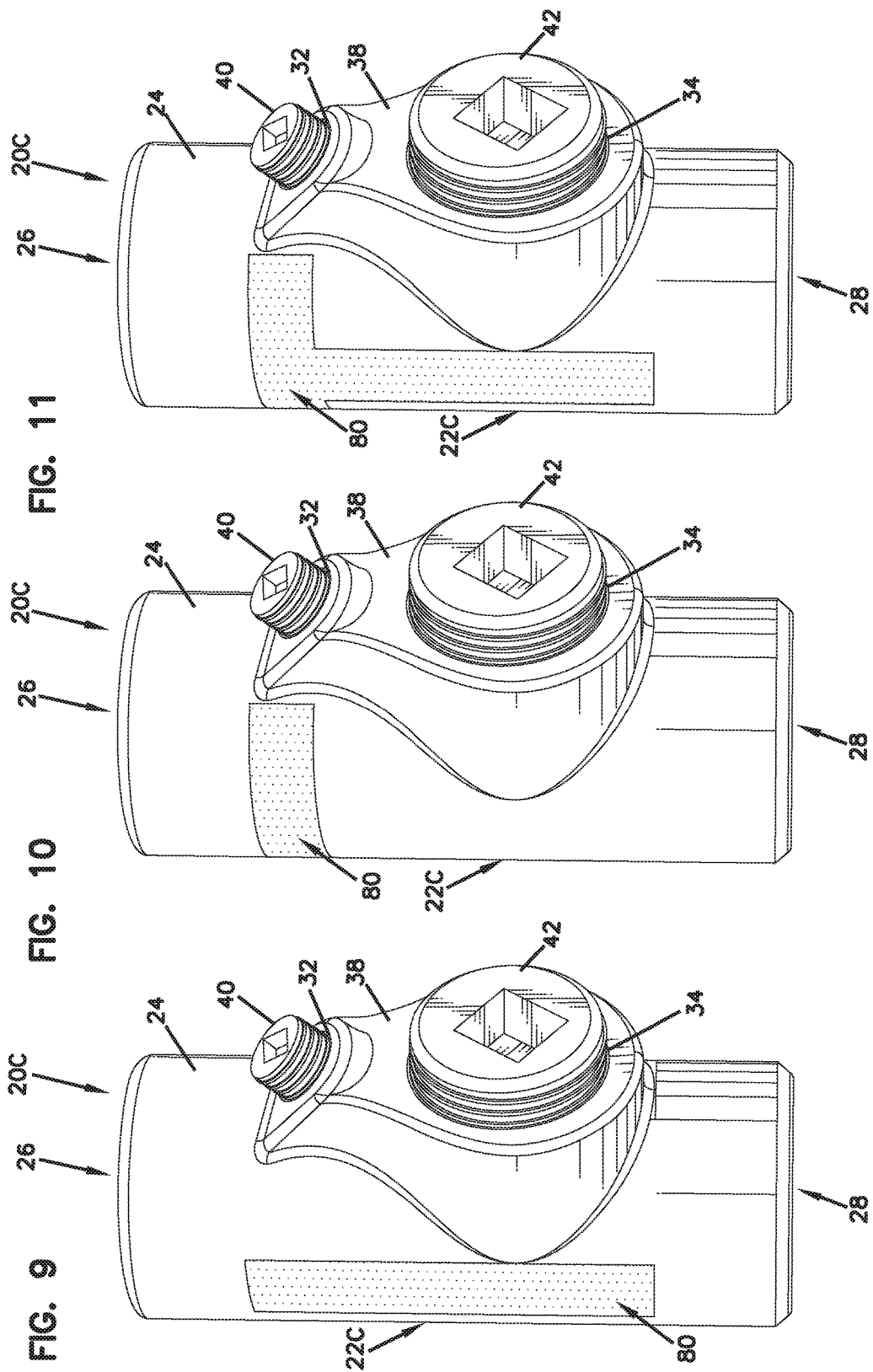

US 10,480,766 B2

EXPLOSION-PROOF ENCLOSURES INCLUDING LIGHT TRANSMISSIVE PORTIONS

CROSS-REFERENCE TO RELATED APPLICATION

The present application claims the benefit of U.S. Provisional Patent Application Ser. No. 62/349,512, filed Jun. 13, 2016, which application is hereby incorporated by reference in its entirety.

TECHNICAL FIELD

The present disclosure relates generally to enclosures for housing electrical components, and more particularly to explosion-proof enclosures.

BACKGROUND

Explosion-proof enclosures are generally known for containing electrical equipment which is used in hazardous environments. Typically, the issue with hazardous environments is that a spark or flame could ignite flammable gasses or other constituents in the operating environment. Explosion proof enclosures are commonly used in hazardous locations in order to contain explosions that may occur within the enclosure and prevent sparks occurring within the enclosure from igniting vapors, gases, or other materials in the area surrounding the enclosure. Hazardous locations may include, for example, aircraft hangars, gasoline stations, paint finishing locations, agricultural areas, etc. Explosion-proof housings are designed and constructed to meet industry standards such as the explosion-proof standards contained in the National Electrical Code (NEC). Explosion proof enclosures often have conduits leading to them. Such conduits may carry cable or wiring, for example, to power circuit protection or control equipment for machinery outside the enclosure, such as a motor or a compressor.

The National Electric Code (NEC®) defines classes and divisions of hazardous locations, as well as requirements for explosion proof enclosures used in such locations. For example, a Class I hazardous location or area is one in which flammable gases or vapors are/could become present in concentrations suitable to produce explosive and/or ignitable mixtures. A typical class I area is a petroleum processing facility, for example. Within Class I, a Division 1 area or location includes: one where the atmosphere of the area is expected to contain explosive mixtures of gases, vapors or liquids during normal working operations; one where ignitable concentrations frequently exist because of repair or maintenance operations; or one where there is release of ignitable concentrations of gases or vapors due to equipment breakdown, while at the same time causing electrical equipment failure. A Class I, Division 2 hazardous location includes: one where flammable liquids or gases are handled, but not expected to be in explosive concentrations, with the possibility of explosive concentrations resulting from an accidental rupture or other unexpected incident; one where ignitable gases or vapors are normally prevented from accumulating by positive mechanical ventilation, but could exist in ignitable quantities if there is a failure in the ventilation system; and areas adjacent to Class I, Division 1 locations where it is possible for ignitable concentrations of gas/vapors to enter the area due to lack of proper ventilation.

Explosion-proof installations are highly regulated and are subject to inspection to ensure compliance with the pertinent regulations and standards. In this regard, there is a need for facilitating the inspection process with respect to explosion-proof installations. There is also a general need for reducing the complexity, part count and cost of explosion-proof enclosures.

SUMMARY

One aspect of the present disclosure relates to an explosion-proof enclosure including at least a portion with a plastic construction that is light transmissive. In certain examples, the light transmissive portion can define a viewing window for allowing of inspection within the enclosure. For example, in the case of enclosures such as sealing fittings and sealing glands, the transmissive portions can allow for inspection of internal seal integrity. In the case of enclosures such as cabinet/box style enclosures for enclosing active electrical components, the transmissive portions can allow for visual equipment inspection and inspection of internal moisture levels. The use of plastic light transmissive portions can also assist in reducing the complexity, part count and cost of explosion-proof enclosures. For example, with respect to explosion-proof enclosures for housing lighting, lighting guards having at least portions with plastic light transmissive portions can reduce complexity, part count and cost.

Another aspect of the present disclosure relates to a sealing fitting rated for use in hazardous environments. The sealing fitting can include a main body that defines an interior volume. The interior volume can be configured to receive a volume of sealant. The main body can also include first and second pipe hubs in fluid communication with the interior volume. The sealing fitting includes at least one sealant filling port in fluid communication with the interior volume. At least a portion of the sealing fitting can be transparent for visual inspection inside the interior volume of the sealing fitting.

Another aspect of the present disclosure relates to a sealing fitting rated for use in hazardous environments. The sealing fitting can include a cylindrical main body with first and second ends that together define a body interior. The cylindrical main body can define a longitudinal axis that extends between the first and second ends. A minor port in fluid communication with the body interior. The minor port, in use can supply sealant into the body interior of the sealing fitting. The sealing fitting further includes a first plug removably inserted into the minor port. At least a portion of the sealing fitting is transparent for visual inspection inside the body interior of the sealing fitting.

A further aspect of the present disclosure relates to a transparent viewing arrangement for use in a conduit system. The transparent viewing arrangement can include a sealing fitting. The sealing fitting can include a cylindrical main body that defines a body interior. The body interior can be configured to receive a volume of sealant. The sealing fitting can also include a major port in fluid communication with the body interior.

Another aspect of the present disclosure relates to a sealing fitting rated for use in hazardous environments. The sealing fitting can include a main body with first and second ends that together define a body interior. The main body can define a longitudinal axis that extends between the first and second ends. The sealing fitting can further include a plug removably inserted into a port that extends into the body interior of the sealing fitting. At least a portion of the sealing fitting is transparent for visual inspection inside the body interior of the sealing fitting.

Another aspect of the present disclosure relates to a conduit system that can include at least one explosion-proof enclosure and at least one sealing fitting in proximity to the explosion-proof enclosure. The sealing fitting can include a cylindrical main body with first and second ends that together define a body interior. The cylindrical main body can define a longitudinal axis that extends between the first and second ends. The conduit systems includes a first conduit that can be connected to the first end of the main body of the sealing fitting and a second conduit that can be connected to the second end of the main body of the sealing fitting. At least a portion of the sealing fitting can be transparent for visual inspection inside the body interior of the sealing fitting.

A further aspect of the present disclosure relates to an enclosure including a cover and a body. The cover can have a cover perimeter flange and the body can have a body perimeter flange. The cover perimeter flange and the body perimeter flange can engage along a joint when the cover and body are in a closed relationship. The enclosure can include an optical transparent window that is defined in the body of the enclosure. The optical transparent window can have a shape configuration adapted for visually observing an interior of the enclosure.

Another aspect of the present disclosure relates to a method of evaluating a conduit system, including an explosion-proof enclosure therein, for visually observing within a sealing fitting. The sealing fitting can include a main body that defines at least a first port that extends therethrough into an interior of the sealing fitting. The sealing fitting can further include at least a first plug removably configured to be inserted into the at least first port. The method can include a step of viewing through a transparent portion of the sealing fitting to inspect the interior of the sealing fitting.

BRIEF DESCRIPTION OF THE DRAWINGS

FIG. 8A is a front view of another example sealing fitting depicting over-mold areas of metallic material in combination with a transparent body in accord with principles of the present disclosure.

FIG. 8B is a side view of the sealing fitting of FIG. 8A.

FIG. 8C is a cross-sectional view of the sealing fitting of FIG. 8A.

FIGS. 9-11A are isometric views of the sealing fitting of FIG. 2 showing various configurations of a transparent window constructed thereon in accord with principles of the present disclosure.

DETAILED DESCRIPTION

Figure 1:
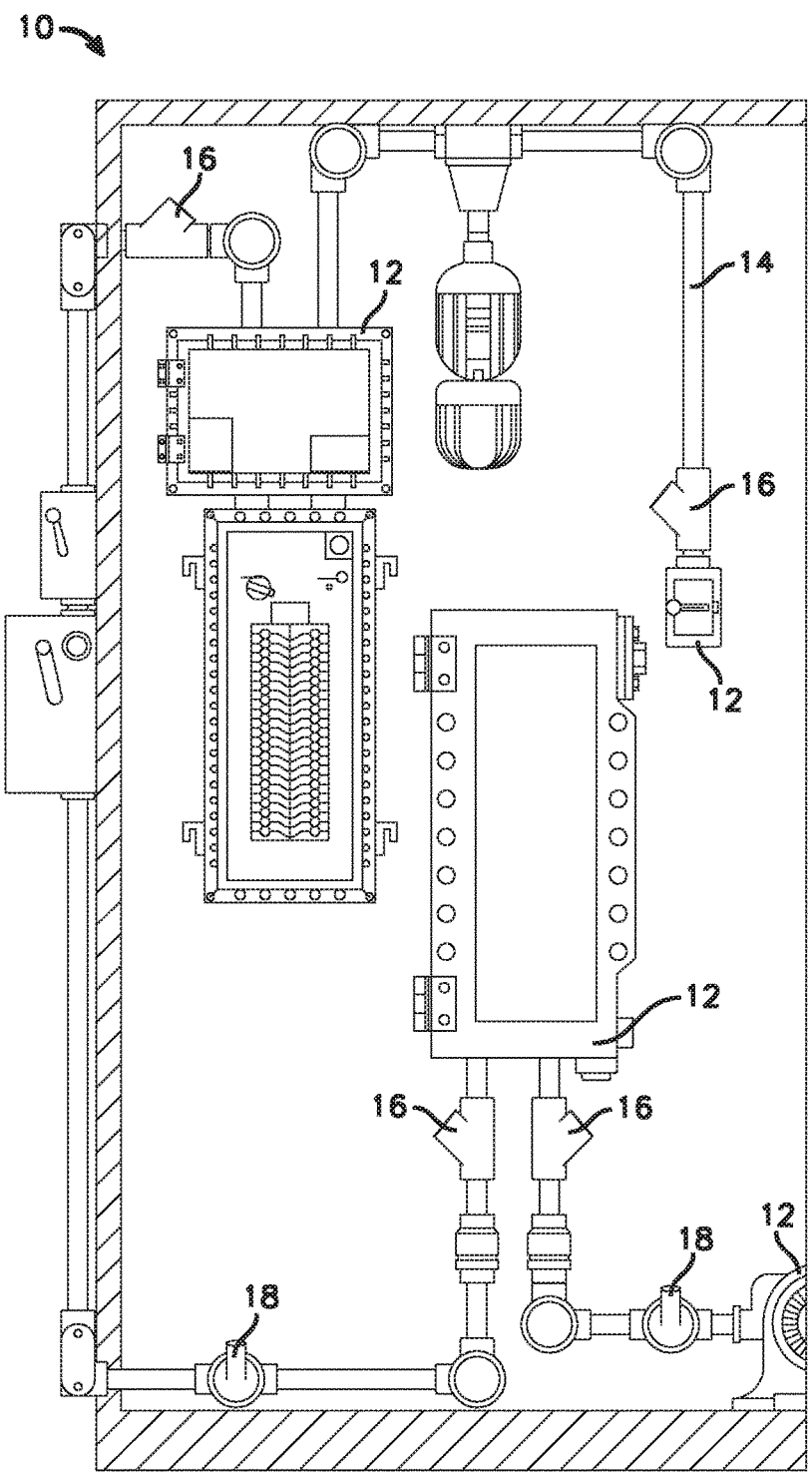
FIG. 1 is a schematic view of an example Class I, Division 1 hazardous location.

Various embodiments will be described in detail with reference to the drawings, wherein like reference numerals represent like parts and assemblies throughout the several views. Reference to various embodiments does not limit the scope of the claims attached hereto. Additionally, any examples set forth in this specification are not intended to be limiting and merely set forth some of the many possible embodiments for the appended claims.

Aspects of the present disclosure relate to explosion-proof enclosures incorporating light transmissive portions such as light transmissive portions have plastic constructions. Example explosion-proof enclosures disclosed herein include sealing fittings, cabinets/boxes for containing active electronics, lighting housings, and sealing glands. The light transmissive portions can be provided for facilitating internal inspection within the enclosures without having to disassembly any portions of the enclosures. Light transmissive portions, particularly plastic transmissive portions, can also be used to reduce cost.

Detailed descriptions of the disclosed apparatus and method are provided below with reference to female sealing fittings configured for use in a horizontal orientation, a vertical orientation, or any other orientation in a conduit system. It should be appreciated, however, that the principles of these disclosures are readily applicable to other sealing fittings, e.g., male sealing fittings, sealing fittings configured for non-horizontal, non-vertical orientations, or specialized sealing fittings such as those configured to provide for water runoff away from the sealant and conduit system.

FIG. 1 is a schematic view of an example Class I, Division 1 hazardous location 10. The hazardous location 10 includes a plurality of cabinet/box style explosion-proof enclosures 12 (e.g., for housing active electronics or the like) and a conduit system 14. The conduit system 14 includes a plurality of explosion-proof enclosures such as first sealing fittings 16 and second sealing fittings 18 in proximity to the explosion-proof enclosures 12. The first sealing fittings 16 (e.g., expanded fill sealing fittings) are used along horizontal and vertical conduits of the conduit system 14. The second sealing fittings 18 are used along conduits in the conduit system 14 that are oriented neither horizontally nor vertically. Both the first and second sealing fittings 16, 18 may be provided in a male configuration or a female configuration as appropriate for the conduit to which it couples.

Figure 2:
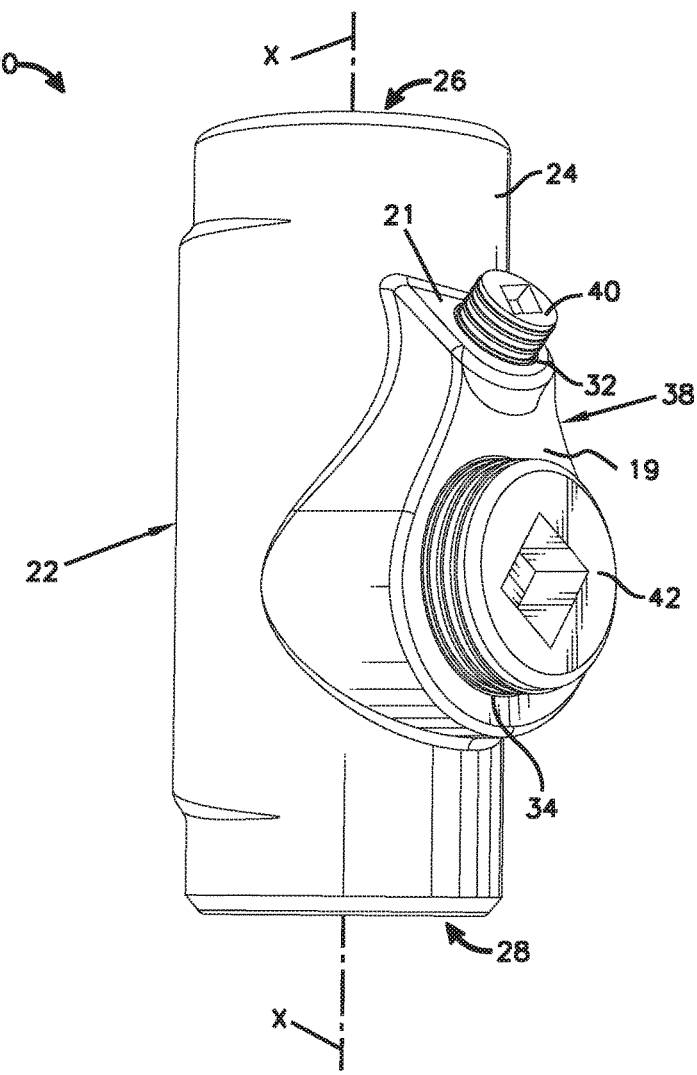
FIG. 2 is an isometric view of a sealing fitting used in Class I hazardous locations including features in accord with selected principles of the present disclosure.

Conduit system seals are usually provided in a sealing fitting. An example of an industry standard sealing fitting 10 is depicted in FIG. 2. The NEC provides that sealing fittings are required at each entrance to an enclosure housing an arcing or sparking device when used in a Class I, Division 1 and 2 hazardous locations, and at each entrance of two inch size or larger to an enclosure or fitting housing terminals, splices or taps when used in Class I, Division 1 hazardous locations. In these scenarios, the sealing fitting must be as close as practicable to the enclosure and in no case more than 18 inches from the enclosure. In addition, the NEC provides for installing sealing fittings in conduit systems when leaving Class I, Division 1 or 2 hazardous locations, and in cable systems when the cables either do not have a gas/vapor tight continuous sheath or are capable of transmitting gases or vapors through the cable core when those cables leave Class I, Division 1 or 2 hazardous locations.

Conduit systems are generally not airtight, such that the type and concentration of gases outside the conduit can also be present inside the conduit. Thus, conduits are provided with seals to prevent explosions from spreading through conduit systems. Seals create a physical barrier that minimizes the passage of gases travelling through the conduit, and also limit the passage of vapors between hazardous and non-hazardous locations. Seals can also serve to prevent pressure piling, i.e., the buildup of pressure inside a conduit caused by precompression as the explosion travels through the conduit.

As mentioned above, typical conduit systems are not airtight. Therefore, changes in temperature or barometric pressure can cause a "breathing" effect in which air enters the conduit system or enclosure. Once air enters a conduit, for example, moisture in the air can condense. If the conduit runs non-horizontally, the condensed water can collect at the base of the conduit, potentially causing equipment shorts or grounds. In these situations, sealing fittings that include a drainage feature can be used to provide an explosion proof path for water to exit while still sealing the conduit.

The seals in sealing fittings are periodically inspected to determine if the seal is compromised and should be reinforced or replaced. Typically, the inspection has to be performed visually through a port provided in the sealing fitting, which can be time consuming.

FIG. 2 is an isometric view of a conventional sealing fitting 20 rated for use in Class I hazardous locations. The sealing fitting 20 can include a main body 22 having a wall 24; a first end 26; and a second end 28 opposite the first end 26 that together define a body interior 30 (see FIG. 4). The main body 22 of the sealing fitting 20 can define a first port 32 (e.g., minor port) and a second port 34 (e.g., major port). It will be appreciated that the number of ports defined in the main body 22 may vary with other embodiments. The second port 34 may be used to fill the interior of the sealing fitting 20 with sealant when the sealing fitting 20 is mounted horizontally. The first port 32 can primarily be used to fill the sealing fitting 20 with sealant when the sealing fitting 20 is mounted vertically. It will be appreciated that the first port 32 may also be used to fill the sealing fitting 20 when it is mounted in other orientations.

The first and second ports 32, 34 can extend through the main body 22 of the sealing fitting 20 into the body interior 30. The first and second ports 32, 34 can each be used to supply sealant 36 (see FIG. 4) into the body interior 30 of the sealing fitting 20. The sealant 36 can be configured to limit the passage of vapors between an explosion-proof enclosure and the atmosphere in a hazardous location. The sealant 36 can be selected from one or more of, e.g., cement type sealing compounds, epoxy sealing compounds, polyurethane sealing compounds, and others, and applied initially in liquid form, foam form, putty form, and so forth. In some examples, a channel can be provided through a portion of the sealant 36 in order to drain water that may collect within the sealing fitting 20. Such a channel can lead to one of the first and second ports 32, 34. The sealing fitting 20 can be oriented such that the first and second ports 32, 34 are at least partially facing a vertically downward direction in order to drain off the water through the port (e.g., through a flame path provided at a threaded interface between a port and a plug closing the port).

The first and second ports 32, 34 can be disposed in a port hub 38 (e.g., platform, boss, embossed port, etc.). The port hub 38 can be an outwardly projecting portion of the wall 24. A first plug 40 can be arranged and configured to be removably inserted in the first port 32 to selectively open and close the first port 32. A second plug 42 can be arranged and configured to be removably placed in the second port 34 to selectively open and close the second port 34. The first and second plugs 40, 42 may be made of one or more of a number of suitable materials, including metal (e.g., alloy, stainless steel, and/or die cast aluminum), plastic, some other material, or any combination thereof. Flame paths can be defined between the plugs and the portions of the fitting defining the ports.

The main body 22 of the example sealing fitting 20 may be cylindrically shaped, although alternatives are possible. The main body 22 can define a longitudinal axis X that extends between the first and second ends 26, 28. The first and second ends 26, 28 can be threaded, although alternatives are possible.

The port hub 38 projects and is offset from the main body 22. The port hub 38 can include a flat surface 19 that defines the second port 34 (e.g., major port). The second port 34 may be used to pull wire through the conduit system. The second port 34 can be aligned perpendicular relative to the longitudinal axis X. The port hub 38 can include an angled surface 21 that defines the first port 32 (e.g., minor port). The first port 32 can be aligned at an angle relative to the longitudinal axis X. The angle of the first port 32 relative to the longitudinal axis X can be an acute angle, although alternatives are possible.

In the example depicted in FIG. 2, the first and second plugs 40, 42 are threadably engaged with the first and second ports 32, 34, respectively; although alternative mounting methods are possible. The first end 26 and the second end 28 can be configured to engage (e.g., threadably) with a conduit to removably couple the sealing fitting 20 to a conduit system in a Class I hazardous location. The first and second plugs 40, 42 are illustrated and described in more detail with reference to FIGS. 6-11.

Figure 3:
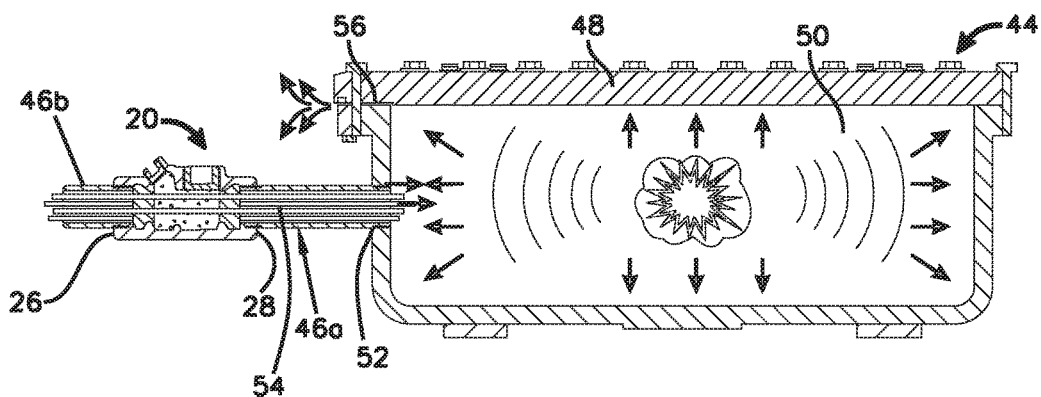
FIG. 3 is a schematic cross-sectional view of an explosion taking place in an example explosion-proof enclosure attached to a conduit system having the example sealing fitting of FIG. 2.

FIG. 3 is a schematic cross-sectional view of an explosion taking place in an example explosion-proof enclosure 44 attached to an example conduit system 46 having the example sealing fitting 20 of FIG. 2. The explosion-proof enclosure 44 can include a container 48 that defines an interior space 50. An entrance 52 through the container 48 can allow one or more devices housed in the interior space 50 to be connected to the outside world, e.g., via wires or cables 54 carrying, e.g., electricity, electrical signals, or so forth. The cables/wires 54 can pass through an interior of the conduit system 46, through the entrance 52 and into the interior space 50.

In this example, the container 48 is equipped with one or more flame paths 56 through which burning gas from an explosion within the container 48 can escape (i.e., vents) and cools before reaching the atmosphere outside the container 48 in a hazardous location. The flame path 56 of the explosion-proof enclosure 44 is capable of preventing a spark or flame that is originated within the explosion-proof enclosure 44 from escaping into a hazardous environment. The explosion-proof enclosure 44 helps to prevent an explosion or fire where flammable gases or materials may exist.

A first pipe hub 58 is defined at the first end 26 of the sealing fitting 20 and a second pipe hub 60 is defined at the second end 28 of the fitting 20. As depicted, the pipe hubs 58, 60 include internal threads. A conduit 46a (e.g., a pipe) couples to the second pipe hub 60 connects the fitting 20 with the entrance 52 to the explosion-proof enclosure 44. Another conduit 46b (e.g., a pipe) is coupled to the first pipe hub 58 and preferably extends toward another enclosure of the system. The first and second conduits 46a, 46b may be connected to the sealing fitting 20 by using threaded connection at the pipe hubs 58, 60, although alternatives are possible. For example, a crimped connection or other connection methods may be used.

As used herein, the term, "pipe hub," is defined as being a part of the sealing fitting that connects to a pipe (e.g., conduit) or other structure. In certain examples, the pipe hub can include a threaded connection, although alternatives are possible. The threaded connection can be configured with either internal or external threads. It will be appreciated that the threaded pipe hubs can have various configurations, such as, but not limited to, 1 pipe hub, 2 pipe hubs that can be aligned, 2 pipe hubs that can be positioned in an L shape, three pipe hubs, four pipe hubs, five pipe hubs, etc.

Figure 4:
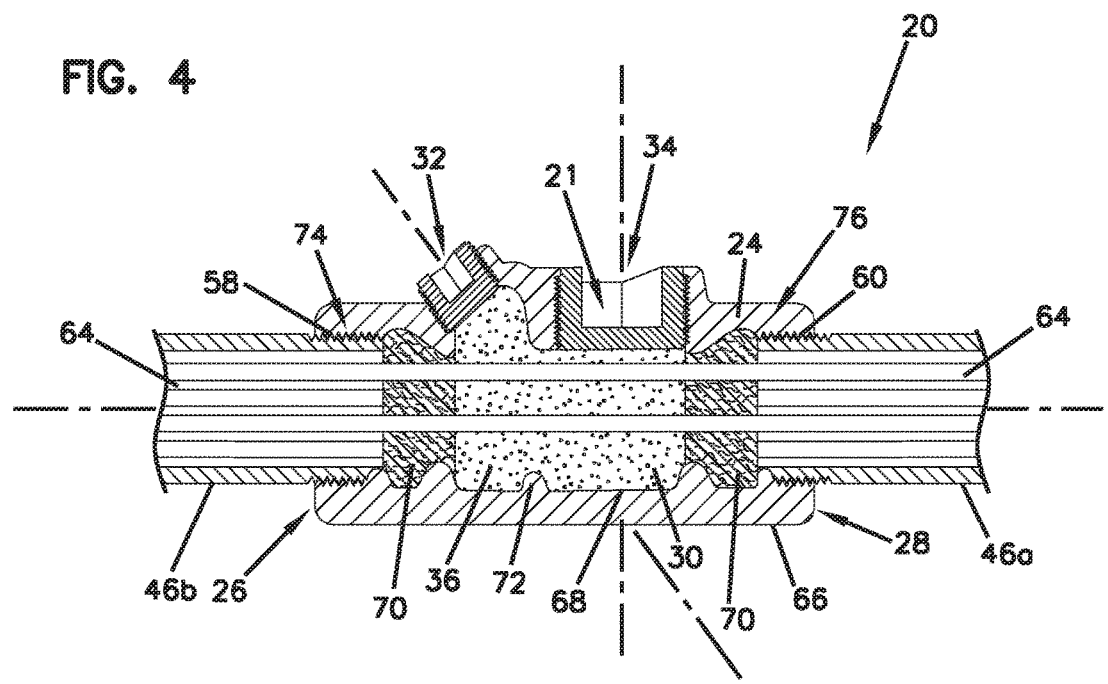
FIG. 4 is a cross-sectional view of the sealing fitting of FIG. 2 connected to two conduits in a horizontal configuration, the sealing fitting including a proper seal.

FIG. 4 is a cross-sectional view of the sealing fitting 20 of FIG. 2 connected to two conduits in a horizontal configuration. As shown, the sealing fitting 20 has a proper seal. The sealing fitting 20 does not include gaps, cracks and/or other imperfections.

Figure 5:
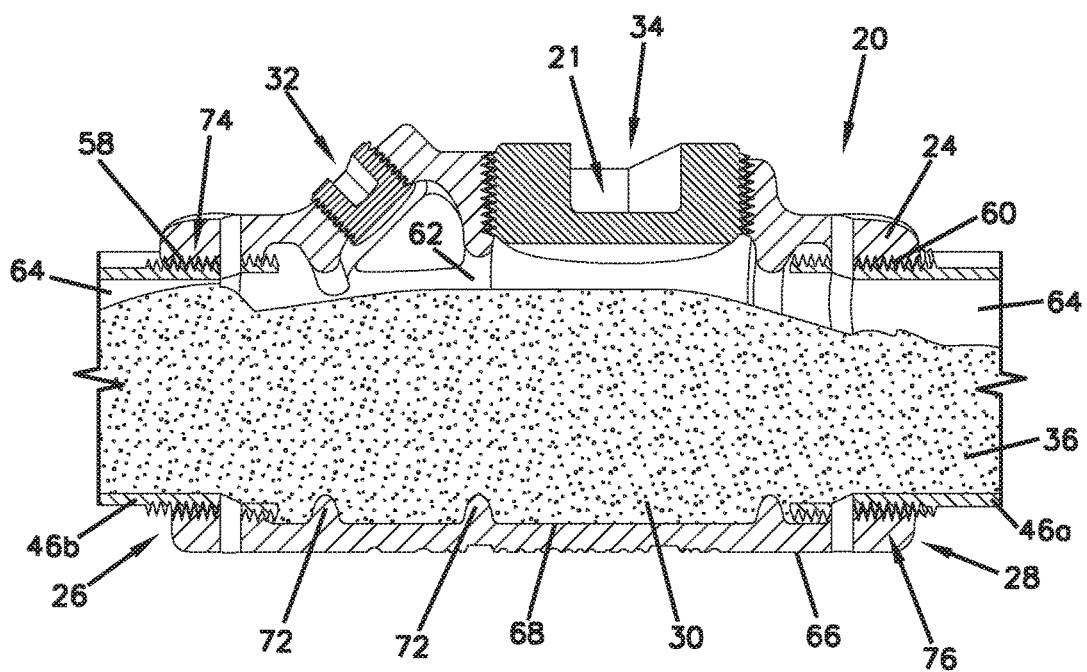
FIG. 5 is a cross-sectional view of the sealing fitting of FIG. 2 connected to two conduits in a horizontal configuration, the sealing fitting including a compromised seal.

FIG. 5 is a cross-sectional view of the sealing fitting 20 of FIG. 2 connected to two conduits in a horizontal configuration. As depicted, the sealing fitting 20 has a compromised seal. The sealant 36 has bled into the conduit system 46, leaving a gap 62 in the sealing fitting 20. The gap 62 presents a potentially hazardous condition, in that it could permit the passage of igniting gas or thermal material from an explosion proof enclosure through the sealing fitting 20 and into the conduit system 46 and/or the atmosphere in a hazardous location. It should be appreciated that FIG. 5 shows one example of a seal imperfection, and that gaps, cracks and/or other imperfections in the sealant can occur at any location within the sealing fitting 20.

Referring to FIGS. 4-5, the conduit system 46 can include an interior channel 64 through which the cables/wires 54 pass. The wall 24 of the sealing fitting 20 can include an outer surface 66 and an inner surface 68 that together define the body interior 30. The sealant 36 can fill at least a portion of the body interior 30. One or more sealant dams 70 (see FIG. 4) composed of a resilient material, e.g. packing fiber, abut the sealant 36 to prevent passage of sealant 36 (e.g., while in a non-solid state) into the conduit system 46. One or more ribs 72 (e.g., annular ribs) can protrude from the inner surface 68 into the body interior 30 to aid in securing the sealant 36 and/or the sealant dams 70 in place within the sealing fitting 20. As depicted, the conduit 46b attaches threadably to the first end 26 of the sealing fitting 20 via a male-female threaded connection 74, although alternatives are possible. The conduit 46a attaches threadably to the second end 28 of the sealing fitting 20 via a male-female threaded connection 76, although alternatives are possible.

Referring to FIG. 4, to create a seal within the body interior 30 of the sealing fitting 20, the conduit system 46 and sealing fitting 20 are connected to each other and to an explosion-proof enclosure. One or both of the first plug 40 and the second plug 42 can be removed from respective ports 32, 34 by unscrewing the plugs 40, 42, although other alternatives are possible. The cables/wires 54 can then be guided through the body interior 30 from the first conduit 58 to the second conduit 60 (or vice versa) by, e.g., inserting a grasping instrument through one of the first and second ports 32, 34 and grasping the cables/wires 54 to feed them through the sealing fitting 20. Once the cables/wires 54 have been routed through the sealing fitting 20, the sealant dams 70 can be placed in the sealing fitting 20 via the first and/or second ports 32, 34. Once the cables/wires 54 have been fed through the sealing fitting 20 and the sealant dams 70 are in place, the sealant 36 can then be poured/placed into one or both of the first and second ports 32, 34 to fill the body interior 30 between the sealant dams 70 around the cables/wires 54 and thereby establish a seal (e.g., upon curing of the sealant 36) that can prevent the passage of potentially igniting gas or other material from the second conduit 60 to the first conduit 58 (or vice versa). After the sealant 36 has been placed, the first and second plugs 40, 42 can be replaced in their respective ports 32, 34.

Seals in hazardous locations should be checked initially after the sealant has cured, and regularly thereafter for damage/degradation that can occur from, e.g., the presence of water in or about the seal, thermal fluctuations, pressure changes and so forth. With the sealing fitting 20 in place within the conduit system 46, one option to check the integrity of the seal upon its creation or thereafter is by prodding a portion of the sealant 36 accessible via the first and second ports 32, 34 to check for potential changes in the hardness/consistency of the sealant 36, which could indicate degradation. Another option for checking the integrity of the seal can be by visual inspection through the sealing fitting 20. The visual inspection can be a manual inspection by the naked eye or by a portable sensing device. The portable sensing device can include one or more of optical light sensors, infrared sensors, ultraviolet sensors, microwave sensors, radar sensors, acoustic sensors, static or dynamic fluid or vapor pressure sensors, chemical indicator sensors, ultrasound sensors and so forth to evaluate the integrity of the sealant 36 located within the body interior 30 of the sealing fitting 20.

Figure 6:
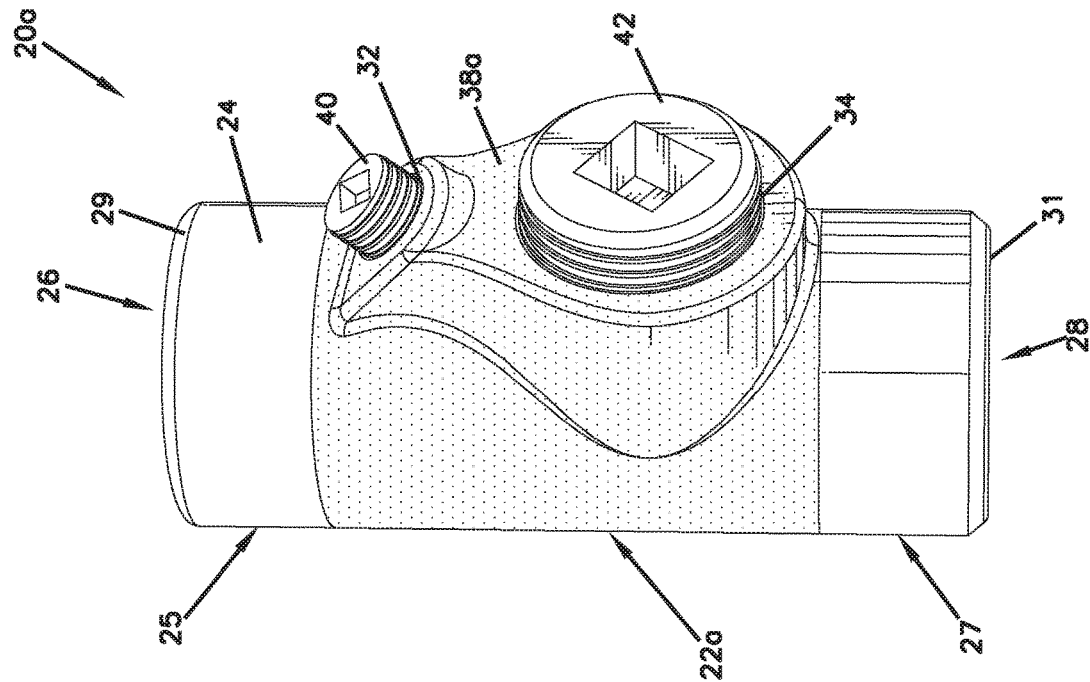
FIG. 6 is an isometric view of the sealing fitting of FIG. 2 showing transparent plastic plugs in accord with selected principles of the present disclosure.

Referring to FIG. 6, the sealing fitting 20 may be arranged and configured to allow for visual inspection therethrough in order to check the integrity of the sealant 36 located within the body interior 30. For example, the first and second plugs 40a, 42a may be made with a transparent material (e.g., plastic or glass) to provide visual inspection through respective first and second ports 32, 34. In one example, the visual inspection is done with the naked eye, although alternatives are possible. For example, the visual inspection can be made using a portable sensing system (not shown) as described above.

The first and second plugs 40a, 42a may be constructed with a co-polyester material, although alternatives are possible. The plastic material used to construct the first and second plugs 40a, 42a provide structural impact resistance and is chemically compatible with other components of the sealing fitting 20. In such a configuration, the first and second plugs 40a, 42a would not need to be removed from corresponding first and second ports 32, 34 for visual inspection to occur. The plastic plugs 40a, 42a would allow for visual confirmation of properly poured sealant 36 and monitoring of the sealant 36 integrity.

The plastic plugs 40a, 42a may be threaded, although alternatives are possible. For example, the plugs 40a, 42a may be threadless such that the first and second plugs 40a, 42a can be manually press fitted into respective ports 32, 34 so that an effective seal is provided. When it is desired to remove the first and second plugs 40a, 42a from respective first and second ports 32, 34, this can readily be accomplished merely by pulling the first and second plugs 40a, 42a from respective first and second ports 32, 34. The first and second plugs 40a, 42a are shown including a square-head socket for threadably fastening into respective first and second ports 32, 34, although alternatives are possible. For example, square head protrusions, hex protrusions, and sockets may also be used. It will be appreciated that a tapered (e.g., cone shaped) plug and receiver may be applied that utilizes a secondary retention feature (e.g., a screw, retaining ring, or threaded ring, etc.) to ensure that a tapered flame path is maintained. In other examples, the first and second plugs 40a, 42a may include a hex-head socket, or a round-head socket.

The sealing fitting 20 may be fabricated of one or more of a number of suitable materials, including metal (e.g., alloy, stainless steel, cast iron, die cast aluminum, extruded steels, and the like), some other material, or any combination thereof.

Figure 7:
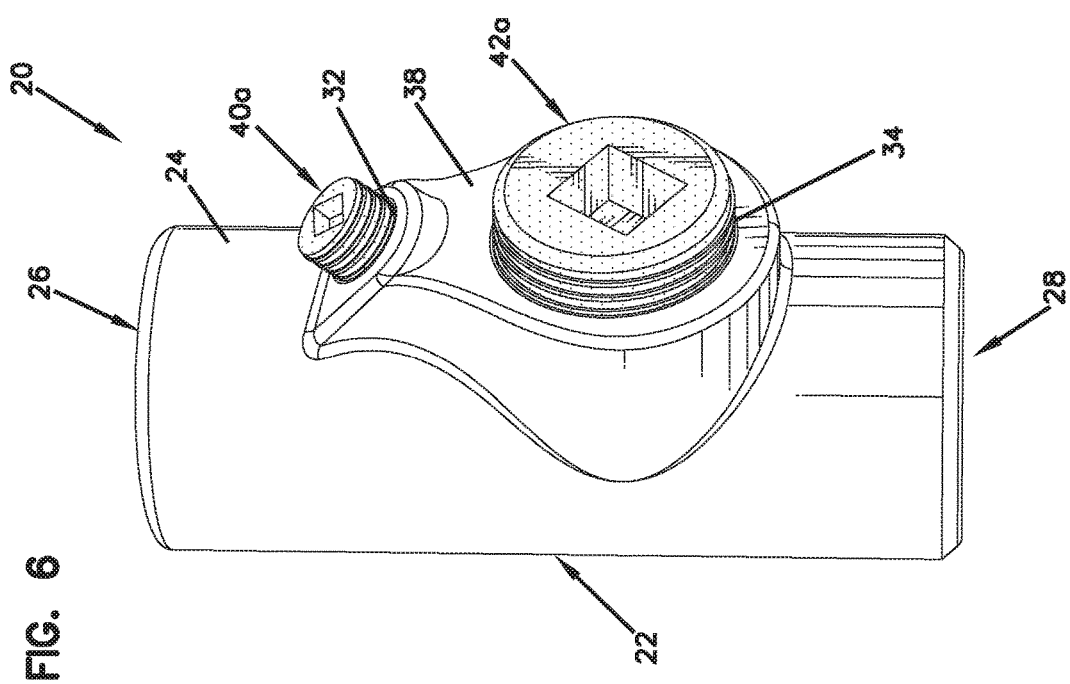
FIG. 7 is an isometric view of an example sealing fitting showing a transparent plastic body in accord with selected principles of the present disclosure.

Referring to FIG. 7, another example of the sealing fitting 20a is shown. In this example, the main body 22a and the port hub 38a of the sealing fitting 20a can be made of a transparent material (e.g., plastic or glass) to provide visual inspection of the sealant 36 disposed within the body interior 30 of the sealing fitting 20a. The main body 22a and port hub 38a can be constructed with transparent material that may cover 80 to 90 percent of the sealing fitting 20a, although alternatives are possible. The transparent material may be co-polyester or some other polymer that provides structural impact resistant while maintaining chemical compatibility.

First and second end caps 25, 27 can attached with respect to the main body 22a of the sealing fitting 20a at respective first and second ends 26, 28. The first and second end caps 25, 27 can be made with a metallic, electrically conductive material that can be used for grounding purposes. The first and second end caps 25, 27 can be made of one or more of a number of suitable materials, including metal (e.g., alloy, stainless steel, die cast aluminum, and/or extruded steels), some other material or any combination thereof.

The first and second end caps 25, 27 can interlock with the main body 22a of the sealing fitting 20a. In certain examples, the first and second end caps 25, 27 may be secured to the main body 22a by an interlock arrangement, although alternatives are possible. For example, the first and second end caps 25, 27 may be threadably mounted to the main body 22a. In other examples, the end caps may be ultrasonically welded to the main body 22a or adhesively bonded to the sealing fitting main body 22a. In other examples, the end caps can be over-molded with respect to the main body 22a. For example, the end caps can be attached to the main body via an insert molding process.

In certain examples, the first and second end caps 25, 27 can define respective first and second end ports 29, 31. The first and second end ports 29, 31 can be constructed with internal threads for receiving and mating with the ends of the conduits 46a, 46b.

Visual inspection through the main body 22a may be conducted manually with the naked eye or with a portable sensing device. Manual visual inspection can be done by looking through any portion of the transparent plastic forming the main body 22a and port hub 38a of the sealing fitting 20a. Constructing the main body 22a and the port hub 38a with transparent material enhances the ability to monitor the seal integrity and confirm properly poured sealant 36. In the example shown, the first and second plugs 40, 42 are not made of a transparent material, although alternatives are possible. For example, the first and second plugs 40, 42 can be constructed of a plastic material, as well as the main body 22a of the sealing fitting 20.

In one example, portions of the sealing fitting 20a can be made using a frame work of metallic material that is electrically conductive for grounding. In certain examples, the metallic material may serve as a structural member of the sealing fitting 20a. Referring to FIG. 8A, another example sealing fitting 20b is depicted that includes a metallic structure 78 that forms a frame-like structure 35 that extends between the first and second ends 26, 28. The metallic structure 78 can be interconnected by ribs 33 (e.g., struts) to connect the metallic structure 78 between the first and second ends 26, 28 and the first and second ports 32, 34. In certain examples, the metallic structure 78 may be integrally formed as one single piece, although alternatives are possible. The metallic structure 78 can help provide the desired structural integrity of the sealing fitting 20b. The metallic material structure 78 can be made of one or more of a number of suitable materials, including metal (e.g., alloy, stainless steel, die cast aluminum, and/or extruded steels), some other material or any combination thereof. The ports 32, 34 are shown with metallic threads, although alternatives are possible. The configuration can allow for suitable grounding of the fitting while concurrently allowing for visual sealant inspection from outside the fitting.

In one example, the transparent main body 22b can be over-molded with respect to a pre-form of the metallic structure 78 using an insert molding process. In one example, the main body can be made of a composition that includes a moldable plastic such as thermoset plastic or a thermoplastic. As shown in FIG. 8B, standard metallic plugs 40, 42 can be used, although alternatives are possible. For example, the plugs 40, 42 may be made from a transparent plastic material. In other examples, the metallic structure 78 may be over-molded or otherwise applied over a pre-form of the transparent main body 2b.

FIG. 8C is a cross-sectional view of the sealing fitting 20b of FIG. 8A. The metallic structure 78 is arranged and configured to be about portion of the sealing fitting 20b to provide the necessary grounding. In one example, the metallic structure 78 can include internal threaded connections at first and second ends 26, 28 such that the conduits 46a, 46b may be mounted therein, although alternatives are possible.

Figure 11A:
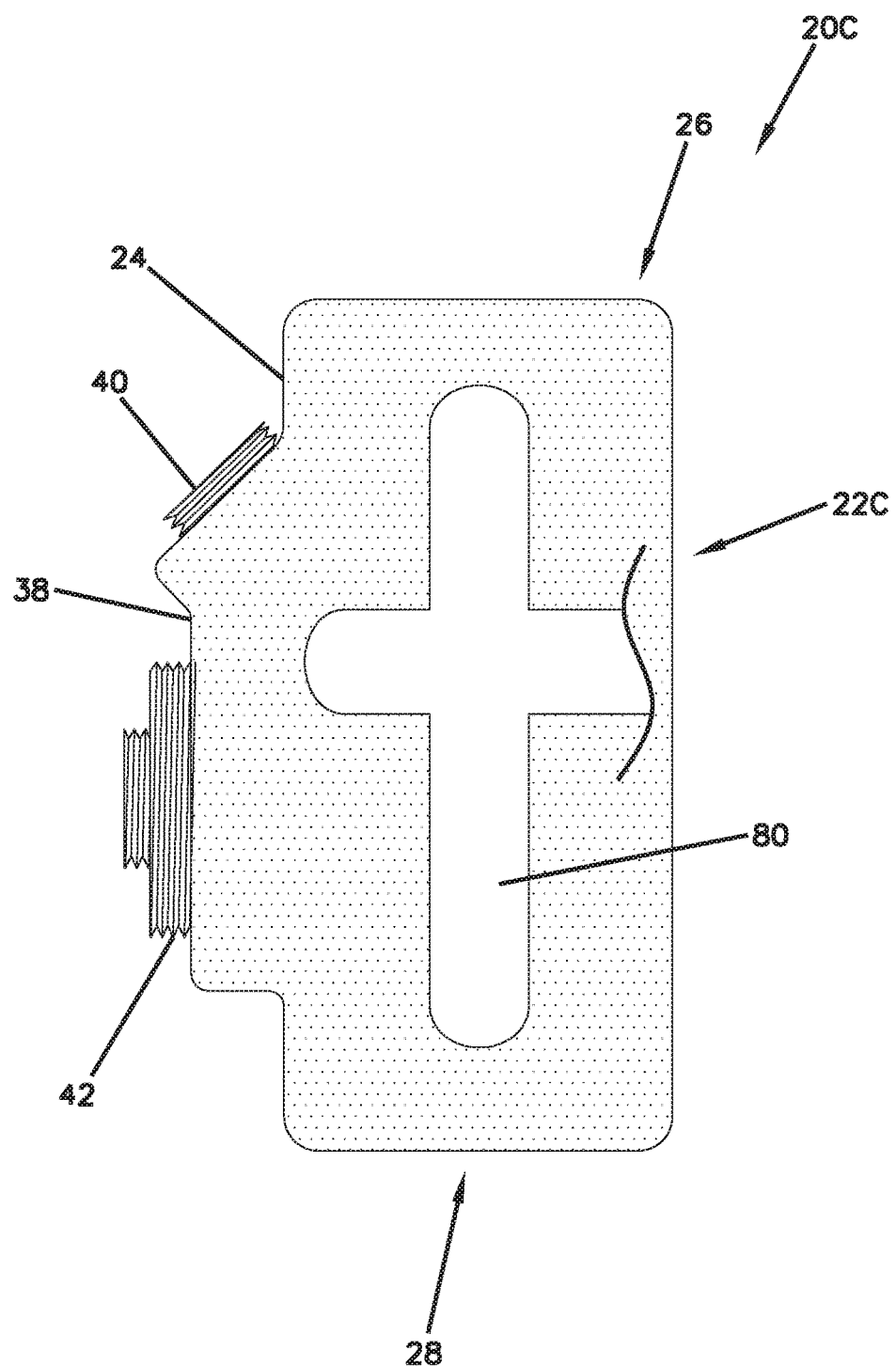

Another example sealing fitting 20c is depicted in FIGS. 9-11A that may be arranged and configured with a transparent window 80. In FIG. 11A, the transparent window 80 is shown on one side of the sealing fitting 20c, although alternatives are possible. For example, the transparent window 80 can be connect to a viewing window on an opposite side of the sealing fitting 20c or the transparent window 80 can be two separate features. It will be appreciated that the transparent window 80 may be shaped and located in various orientations than what is shown in the examples. For example, the transparent window 80 may be constructed with a plastic material that is compatible with the sealing fitting 20c as well as provides structural impact resistance. The plastic material may be co-polyester, although alternatives are possible. Glass may also be used. The transparent window 80 provides visible access to inspect whether sealant has been installed properly. The transparent window 80 also allows for monitoring seal integrity within the body interior 30 of the sealing fitting 20c.

It will be appreciated that the transparent sections depicted in the various examples provide for significant longitudinal and circumferential visibility to the compound or sealant. For example, the "t-shaped" window shown in FIGS. 11 and 11A, can help to provide visible inspection of whether there is a crack/crevasse present within the sealing fitting.

In the example shown in FIGS. 9-11A, the first and second plugs 40, 42 may be made of one or more of a number of suitable materials, including metal (e.g., alloy, stainless steel, and/or die cast aluminum), plastic, glass, some other material, or any combination thereof. For example, the first and second plugs 40, 42 can be constructed of a plastic material, as well as the transparent window 80 defined in the sealing fitting 20c.

It will be appreciated that the transparent material constructed as described above for the various examples including the first and second plugs 40, 42, the main body 22, the port hub 38, and the window 80 may include a color or tint. Such coloring would not change the transparency of the material or limit the ability to visibly observe the sealant 36 located within the sealing fitting 20. For example, the transparent material may be yellow or orange, although alternatives are possible. An optical sensing device (not shown) can be used to inspect the sealant and monitor the integrity thereof. Additionally, for the various examples discussed herein, while the light transmissive material used to form the viewing locations is preferably plastic, other light transmissive materials such as glass can also be used.

Figure 12:
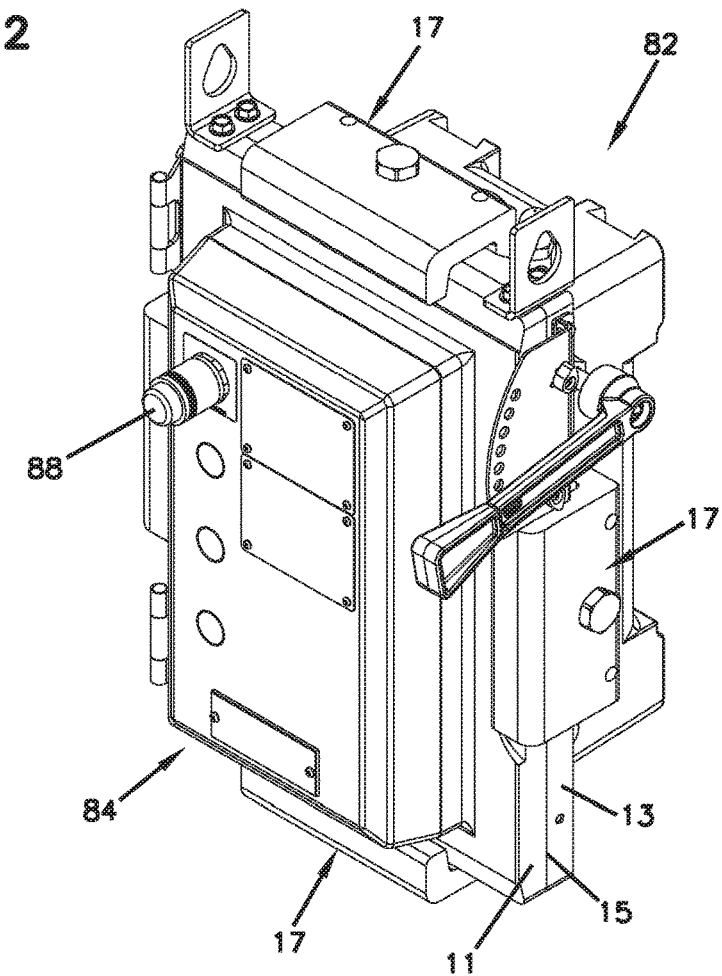
FIG. 12 is a schematic perspective view of an explosion-proof enclosure including features in accord with selected principles of the present disclosure.
Figure 13:
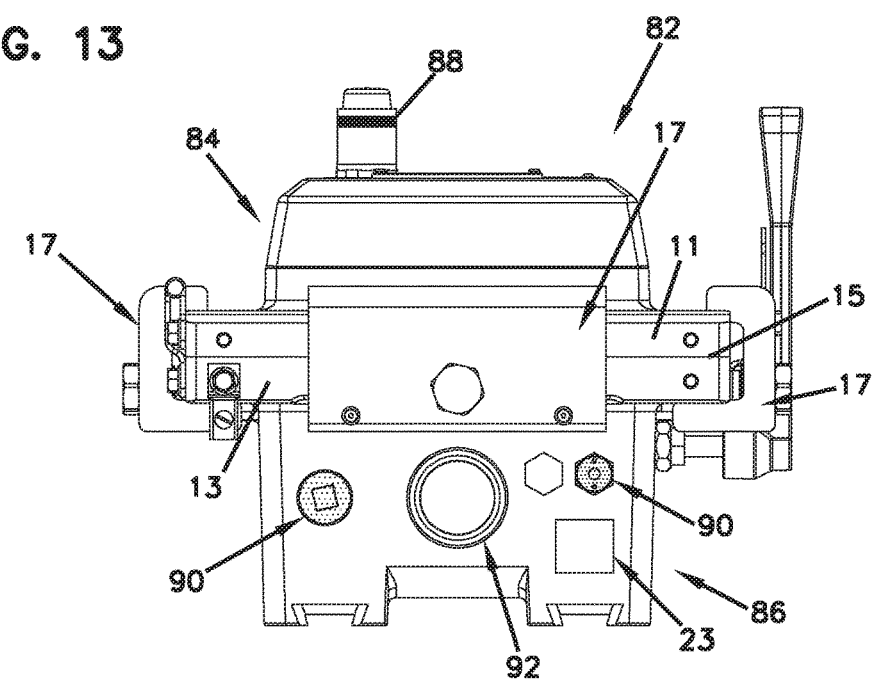
FIG. 13 is a schematic bottom end view of the explosion-proof enclosure of FIG. 12 depicting a transparent viewing window in accord with principles of the present disclosure.

Referring to FIGS. 12 and 13, an example enclosure is shown. The example enclosure depicted is an electrical equipment enclosure. The example depicted is specifically an explosion-proof enclosure 82. While the examples discussed herein are with reference to explosion-proof enclosures 82, other types of non-explosion-proof enclosures (e.g., junction boxes, control panels, lighting panels, motor control centers, switchgear cabinets, relay cabinets) or any other type of enclosure (e.g., a flame-proof enclosure) may be used.

The explosion-proof enclosure 82 includes a cover section or cover 84 and a body section or body 86. The cover 84 can have a cover perimeter flange 11 and the body 86 can have a body perimeter flange 13. The cover perimeter flange 11 and the body perimeter flange 13 can engage along a joint 15 when the cover 84 and body 86 are in a closed relationship. The explosion-proof enclosure 82 can include a clamp arrangement 17 configured to secure the cover perimeter flange 11 and the body perimeter flange 13 together, although alternatives are possible. For example, it will be appreciated that a bolt or threaded cover may be used to secure the cover perimeter flange 11 and the body perimeter flange 13 together.

The explosion-proof enclosure 82 can be used to house active electrical components, such as, circuit breakers, motor starters, switches, relays, terminals and meters, for example. The term, "active", in this context, means that the electrical components are electronically operating within the explosion-proof enclosure 82. The cover 84 and body 86 can be fabricated of a material, e.g., steel, cast iron, and the like, that can be mated together to form a joint therebetween or a flame path. The flame path of the explosion-proof enclosure 82 is capable of preventing a spark or flame that is originated within the explosion-proof enclosure 82 from escaping into a hazardous environment. The enclosure helps to prevent an explosion or fire where flammable gases or materials may exist.

The explosion-proof enclosure 82 can include one or more control elements or indicators (e.g., knobs, switches, lights, etc.) for controlling and/or indicating the status of equipment housed therein. As depicted, an indicator light 88 (e.g., a pilot light). Plugs 90 of various sizes can be configured on the explosion-proof enclosure 82 for receiving wiring of electrical components or for plugging holes in the explosion-proof enclosure 82 that are not being used.

The explosion-proof enclosure 82 may also include reducers 92 that are threaded on the inside and outside for reducing thread sizes on electrical systems that have smaller conduits. Breathers and/or drains can optionally be mounted on the explosion-proof enclosures 82 to let products breath and/or to let condensation/water out of the enclosure 82 to maintain the explosion-proof system.

Typically, explosion-proof enclosures are designed such that screws or bolts are used to fasten the cover 84 onto the body 86 of the explosion-proof enclosure 82. The bolted body 86 and cover 84 connection ensures that a flame path of both the cover 84 and body 86 stay in contact with each other. The number of bolts increases the inconvenience of the use of the explosion-proof enclosure, since the bolts need be installed and then removed to examine or work in the interior of the explosion-proof enclosure 82 after installation. It is desirable to monitor or inspect the explosion-proof enclosure 82 for moisture build up or to inspect equipment therein. It will be appreciated that the advantages of the present disclosure can allow for a quick accessible view into the explosion-proof enclosure 82.

In certain examples, the plugs 90 may be constructed with transparent material (e.g., plastic) to observe and/or inspect the inside of the explosion-proof enclosure 82 without having to remove the cover 84. The inspection would provide quick identification of number, size, type and integrity of equipment inside the explosion-proof enclosure 82. The inspection would also provide for quick identification of moisture within the explosion-proof enclosure 82. The visual inspection can be by a portable sensing device. The portable sensing device can include one or more of optical light sensors, infrared sensors, ultraviolet sensors, microwave sensors, radar sensors, acoustic sensors, static or dynamic fluid or vapor pressure sensors, ultrasound sensors, chemical indicator sensors, and so forth to evaluate the integrity of the sealant 36 located within the body interior 30 of the sealing fitting 20. The portable sensing device can be placed adjacent to the plugs 90 for optical sensing function.

In other examples, the explosion-proof enclosure 82 may include an optical transparent window 23 defined in the body 86. The optical transparent window 23 can be arranged and configured to allow for a manual visual inspection inside the explosion-proof enclosure 82 without having to open the enclosure-proof enclosure 82. The manual inspection can be conducted with the naked eye, although alternatives are possible. For example, the inspection may be done with a portable sensing device.

The optical transparent window 23 may be constructed with a transparent material (e.g., a plastic material or a glass material) such as, but not limited to, co-polyester. The construction of the optical transparent window 23 can be such that it has a shape configuration adapted for visually observing into an interior of the explosion-proof enclosure 82. The transparent window 23 can be positioned anywhere on the explosion-proof enclosure 82. For example, the transparent window 23 may be positioned on a top, a side, and/or a bottom of the explosion-proof enclosure 82. In other examples, the transparent window 23 may be positioned on the cover 84 of the explosion-proof enclosure 82.

Figure 13A:
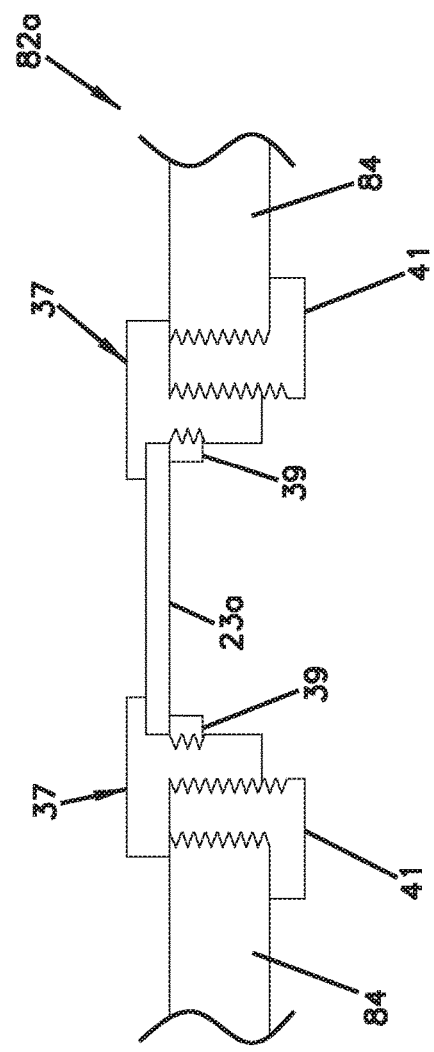
FIG. 13A is a schematic cross-sectional view showing an example transparent window for use in an explosion-proof enclosure in accord with selected principles of the present disclosure.

Referring to FIG. 13A, a cross-sectional view of a portion of an explosion-proof enclosure 82a is shown. In this example, an optical transparent window 23a can be threaded to the explosion-proof enclosure 82a utilizing existing structure of the explosion-proof enclosure 82a. As shown, the transparent window 23a is located in the cover 84 of the explosion-proof enclosure 82a secured between a bezel 37 and a clamp ring 39 that is attached to the bezel 37 by a threaded connection, although alternatives are possible. A retaining ring 41 can be used as an intermediate member to secure the bezel 37 and cover 84 together by a threaded connection, although alternatives are possible.

In other examples, plugs similar to 40a, 42a may be installed in the explosion-proof enclosure 82a in accord with principles of the present disclosure.

Figure 13B:
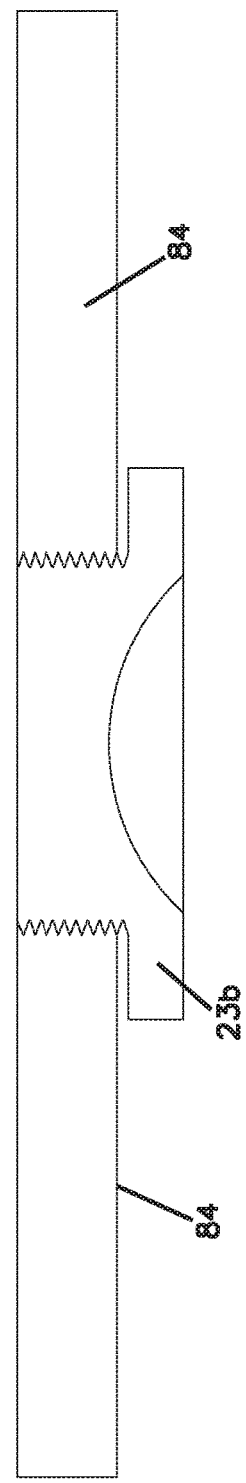
FIG. 13B is a schematic cross-sectional view showing another transparent window for use in an explosion-proof enclosure in accord with selected principles of the present disclosure.

Referring to FIG. 13B, a cross-sectional view of a portion of the explosion-proof enclosure 82b is shown with an optical transparent window 23b mounted to the cover 84 by a threaded connection. In this example, the optical transparent window 23b is mounted to the explosion-proof enclosure 82b utilizing a single part, although alternatives are possible. The optical transparent window 23b is shown with a convex or concave shape to help improve optical performance. In some examples, the optical transparent window 23b can be constructed with a pattern to provide the desired optical characteristics for viewing purposes. It will be appreciated that other shapes and/or configurations may be used.

Figure 13C:
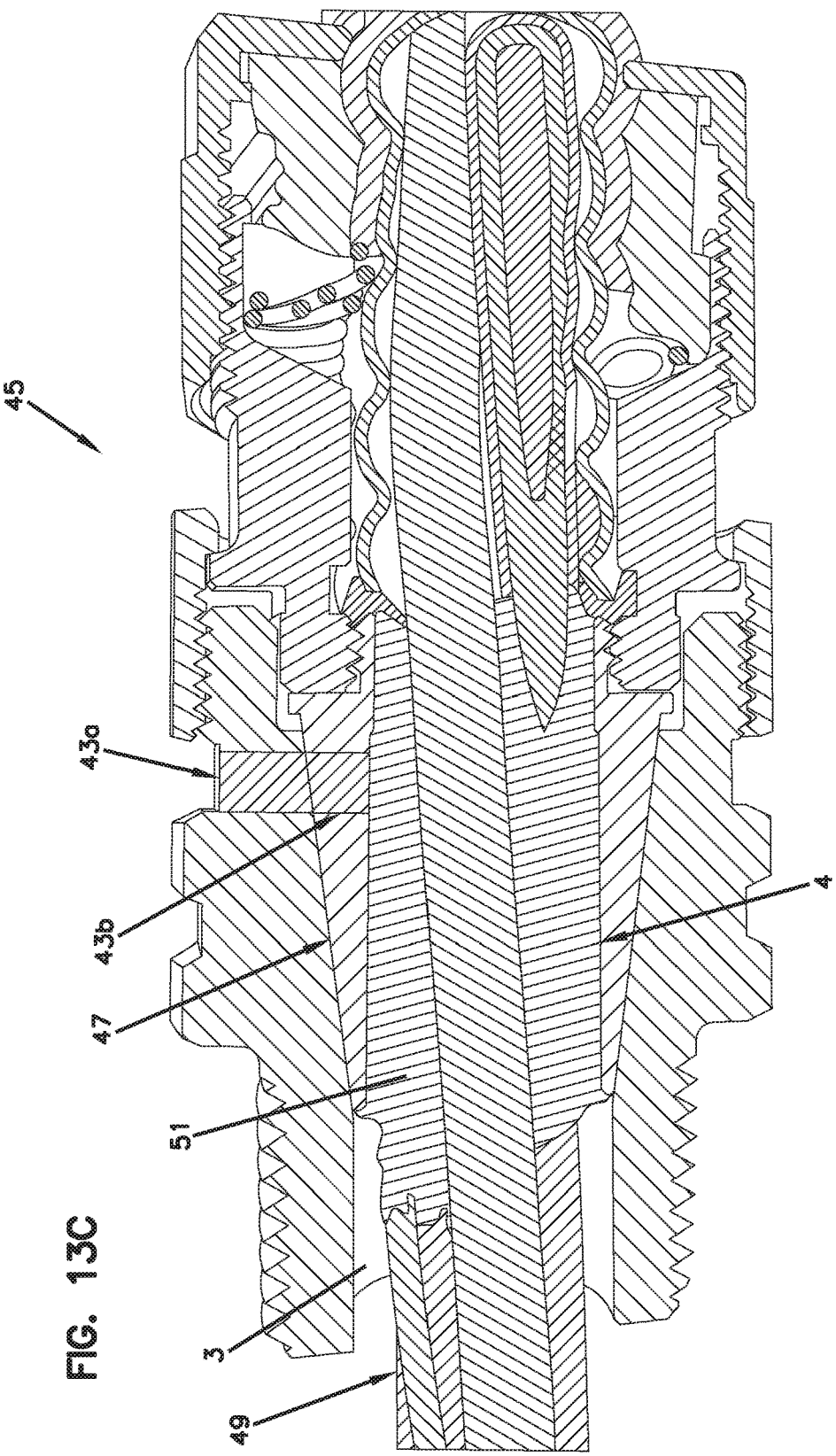
FIG. 13C is a cross-sectional view of an example cable gland including a transparent window in accord with selected principles of the present disclosure.

Referring to FIG. 13C, an example transparent window 43 is shown for a cable gland 45 application. Cable glands can be used in hazardous, industrial and commercial applications, engineering safety and productivity in the most severe environmental conditions. The example cable gland 45 depicted includes a threaded sleeve 1 (e.g., main body) and a conical (e.g., tapered) plug 2 that fits within the threaded sleeve 1. The threaded sleeve 1 of the cable gland includes external threads for connecting to an explosion-proof enclosure. The threaded sleeve 1 defines an internal bore 3 that receives the conical plug 2. The conical plug 2 can provide a compound chamber 4 within the cable gland 45. The cable gland 45 includes a flame path 47 between the threaded sleeve 1 and the conical plug 2.

The threaded sleeve 1 is arranged and configured for receiving an armoured cable 49 and a sealing compound 51. The threaded sleeve 1 and the conical plug 2 are each arranged and configured with a transparent window 43a, 43b. The transparent windows 43a, 43b of both the threaded sleeve 1 and the conical plug 2 can be aligned to provide viewing access of the sealing compound 51 within the compound chamber 4 of the cable gland 45. The cable gland 45 can be arranged and configured to retain enough conductive material to achieve the appropriate grounding while allowing alignment of the transparent windows 43a, 43b in both the threaded sleeve 1 and the conical plug 2. It will be appreciated that other types of cable glands may be arranged and configured with a transparent window in accord with the present disclosure.

Figure 14:
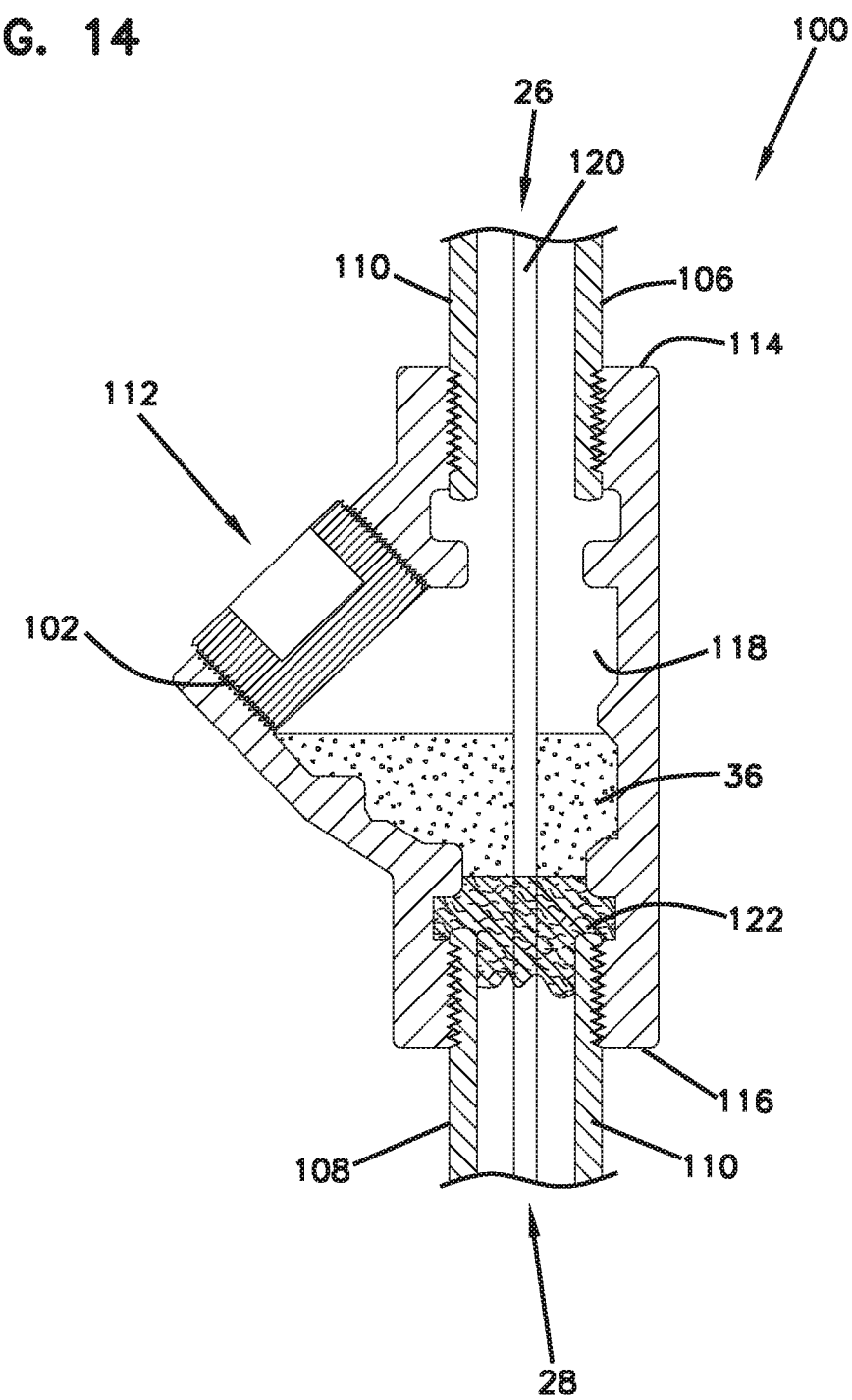
FIG. 14 is a cross-sectional view of a further example of a vertical sealing fitting connected to two conduits.

FIG. 14 is a cross-sectional view of another sealing fitting 100 that is oriented vertically and includes a single port 102 connected to first and second vertical conduits 106 and 108 in a conduit system 110. It will be appreciated that the sealing fitting 100 has many of the same features previously described with respect to the transparent plugs and transparent windows and, for the sake of brevity such components will not be re-described with respect to the sealing fitting 100.

The first vertical conduit 106 can be connected to the first end 26 of the sealing fitting 100 and the second vertical conduit 108 can be connected to the second end 28 of the sealing fitting 100. The sealing fitting 100 differs from that of the sealing fitting 20 in that the sealing fitting 100 includes the single port 102 having a single plug 112. The sealing fitting 100 is positioned vertically, such that it has a top 114 and a bottom 116.

The single plug 112 may be made of one or more of a number of suitable materials, including metal (e.g., alloy, stainless steel, and/or die cast aluminum), plastic, some other material, or any combination thereof. The sealing fitting 100 may be made of one or more of a number of suitable materials, including metal (e.g., alloy, stainless steel, and/or die cast aluminum), plastic, some other material, or any combination thereof.

Referring to FIG. 5, to create a seal within an interior space 118 (e.g., body interior) of the sealing fitting 100, the conduit system 110 and sealing fitting 100 are connected to each other and to an explosion-proof enclosure. The plug 112 may have threads such that it can be removed from the port 102 by unscrewing the plug 112, although alternatives are possible. Cable/wire 120 can then be guided through the interior space 118 from the first vertical conduit 106 to the second vertical conduit 108 (or vice versa) by, e.g., inserting a grasping instrument through the port 102 and grasping the cable/wire 120 to feed it through the sealing fitting 100.

A sealant dam 122 can then be placed in the sealing fitting 100 via the port 102. Once the cable/wire 120 has been fed through the sealing fitting 100, sealant 36 can then be poured downward into the port 102. The sealant 36 travels towards the bottom 116 of the sealing fitting 100 under the influence of gravity, settling on the sealant dam 122 and filling up a portion of the interior space 118 around the cable/wire 120 to thereby establish a seal (e.g., upon curing of the sealant 36) that can prevent the passage of a potentially igniting gas or thermal material from the second conduit 108 to the first conduit 106 (or vice versa). After the sealant 36 has been placed, the plug 112 can be replaced in the single port 102.

The present disclosure also relates to a method of evaluating a conduit system 46, including an explosion-proof enclosure 82 therein, for visually observing structural integrity of sealant 36 within a sealing fitting 20. The sealing fitting 20 can include a main body 22 that defines at least a first port 32 that extends therethrough into an interior 30 of the sealing fitting 20 and at least a first plug 40 removably configured to be inserted into the at least first port 32. The method can include a step of viewing through a portion of the sealing fitting 20 to inspect the integrity of sealant 36 located within the interior 30 of the sealing fitting 20. In one example, the step of viewing is with a naked eye. In other examples, the step of viewing is through the at least first plug 40. In other examples, the step of viewing is through the main body 22 of the sealing fitting 20.

The method can further include a step of viewing through the transparent window 23 of the explosion-proof enclosure 82 for observing the physical status or condition of equipment within the explosion-proof enclosure 82. For example, the transparent window 23 can be used to determine whether a switch is turned on or off. The step of viewing through the transparent window 23 may also be performed to verify sealant.

In certain examples, the step of viewing is by a portable sensing device (not shown). The portable sensing device can include one or more of optical light sensors, infrared sensors, ultraviolet sensors, microwave sensors, radar sensors, acoustic sensors, static or dynamic fluid or vapor pressure sensors, chemical indicator sensors, ultrasound sensors, and so forth to evaluate the integrity of the sealant 36 located within the interior 30 of the sealing fitting 20.

The present disclosure further relates to a conduit system 46 that can include at least one explosion-proof enclosure 82 and at least one sealing fitting 20 in proximity to the explosion-proof enclosure 82. The sealing fitting 20 can include a main body 22 having a wall 24; a first end 26; and a second end 28, that together define a body interior 30. The main body 22 can define at least a first port 32 that extends therethrough into the body interior 30. The at least first port 32 can have means for supplying sealant 36 into the body interior 30 of the sealing fitting 20. The sealant 36 can be configured to limit the passage of vapors between the explosion-proof enclosure 82 and the atmosphere in a hazardous location. The conduit system 46 also includes at least a first plug 40 removably inserted into the at least first port 32. The at least first plug 40 can have means for visually observing the sealant 36 disposed within the body interior 30 of the sealing fitting 20. A conduit 46b can be connected to the first end 26 of the main body 22 of the sealing fitting 20 and a conduit 46a can be connected to the second end 28 of the main body 22 of the sealing fitting 20.

Figure 15:
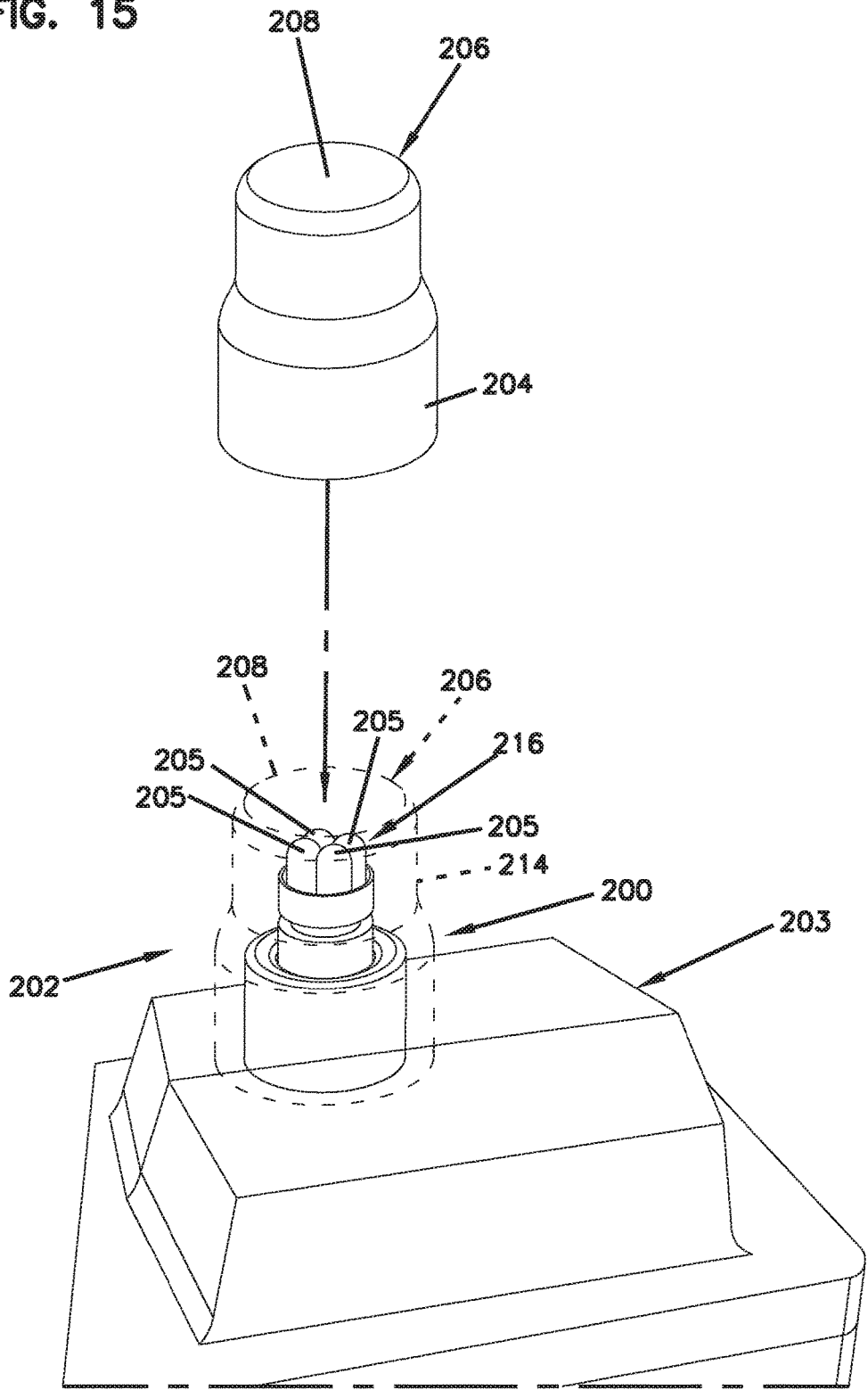
FIG. 15 is a schematic perspective view of another explosion-proof enclosure including features in accord with selected principles of the present disclosure.

Turning to FIG. 15, an example structure 200 for housing an electrical component is depicted in accordance with the principles of the present disclosure.

The example structure 200 can include an explosion-proof enclosure 202 rated for use in a hazardous location. The explosion-proof enclosure 202 can include at least one flame path. The structure 200 is shown mounted to another explosion-proof enclosure 203.

In certain examples, the explosion-proof enclosure 202 can include at least a portion having a plastic construction 204 that is light transmissive (e.g., capable of allowing light to pass therethrough). The plastic construction 204 can be made with transparent materials and/or translucent materials, which are each light transmissive. In one example, the plastic construction 204 can include a polyester, PTFE (polytetrafluoroethylene), although alternatives are possible. For example, the plastic construction 204 can include polycarbonate or acrylic. In certain examples, the plastic construction 204 can include polycyclohexylene dimethylene terephthalate copolyester resin. In other examples, the plastic construction 204 may be a co-polyester.

In one example, the portion of the explosion-proof enclosure 202 that includes the plastic construction 204 that is light transmissive can be provided as at least part of a lighting guard 206. The lighting guard 206 can include a closed end 208 positioned opposite from an open end 210 (see FIG. 16), and internal threads 212 (see FIG. 16) adjacent the open end 210. In the example depicted, the internal threads 212 can provide the explosion-proof enclosure 202 with at least one flame path, although alternatives are possible. A flame path is capable of preventing a spark or flame that is originated within an explosion-proof enclosure from escaping into a hazardous environment. An explosion-proof enclosure helps to prevent an explosion or fire where flammable gases or materials may exist.

The lighting guard 206 can define an interior enclosure volume 214 in which a light emitter 216 can be housed. In one example, the light emitter 216 can include at least one light emitting diode or LED 205, although alternatives are possible. The lighting guard 206 may include a polymer that provides structural impact resistance while providing improved light distribution performance. As such, the lighting guard 206 can eliminate the need for any additional structure to guard the light emitter 216 from impact damage.

Figure 16:
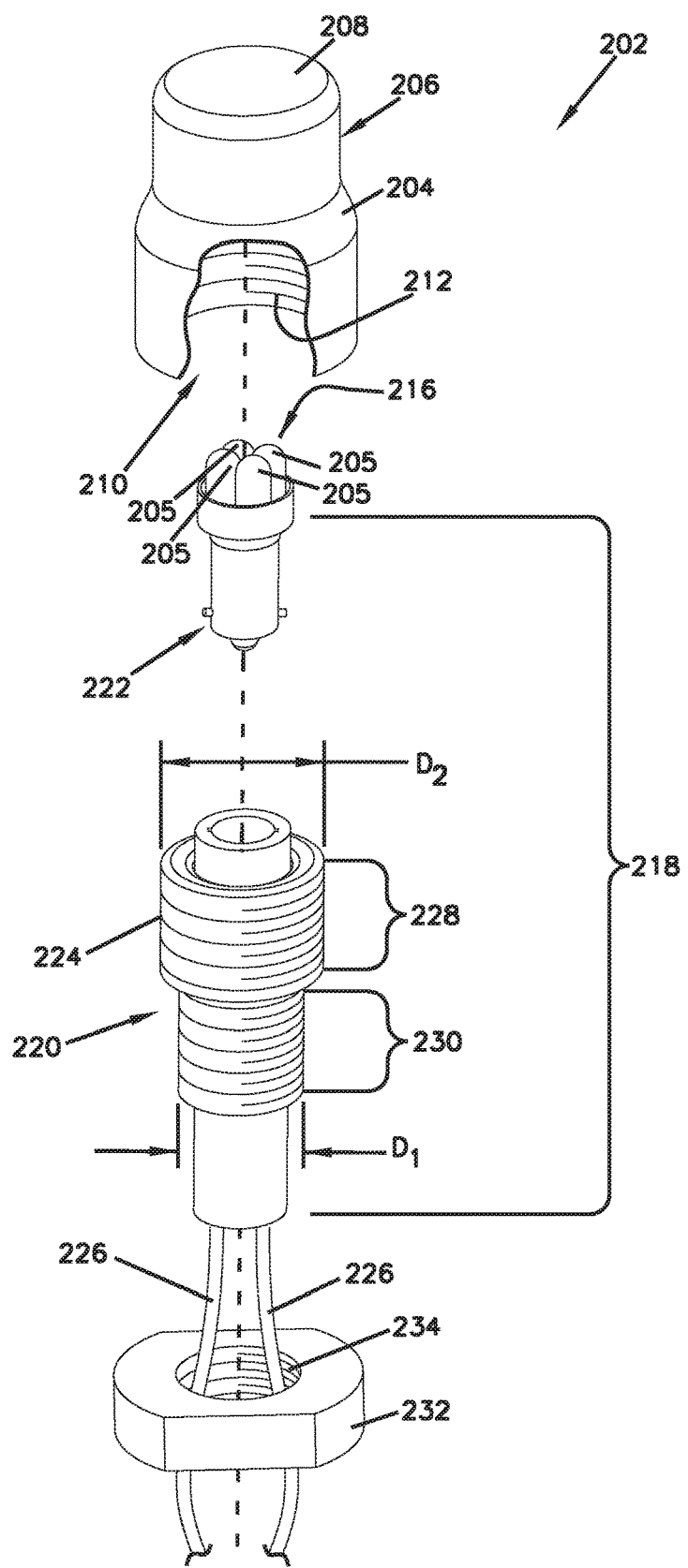
FIG. 16 is a schematic exploded view of the explosion-proof enclosure of FIG. 15.

Referring to FIG. 16, an exploded view of the explosion-proof enclosure 202 of the structure 200 is depicted.

The light emitter 216 can include a lighting unit 218 that has a base 220 and a light emitting structure 222 carried with the base 220. The base 220 can include external threads 224 that mate with the internal threads 212 of the lighting guard 206 to secure the base 220 within the lighting guard 206 with the base 220 enclosing the open end 210 of the lighting guard 206. As such, the light emitting structure 222 of the lighting unit 218 can be positioned within the interior enclosure volume 214 of the lighting guard 206 between the base 220 and the closed end 208 of the lighting guard 206. Electrical wires 226 can be routed through the base 220 to the light emitting structure 222 to connect the at least one LED.

It will be appreciated that the threaded flame path can be defined between the external threads 224 of the base 220 and the internal threads 212 of the lighting guard 206. In other examples, the flame path may be defined by the mating of any two or more surfaces of the enclosure. The flame path may provide a path from inside the explosion-proof enclosure to outside the explosion-proof enclosure, along which one or more gases may travel.

The external threads 224 of the base 220 can include a first set of threads 228 and a second set of threads 230. In the example shown, a portion of the base 220 that includes the second set of threads 230 has a diameter $D_1$, which is smaller than a portion of the base 220 that includes the first set of threads 228 that has a diameter $D_2$. The first set of threads 228 can mate with the internal threads 212 of the lighting guard 206 to make a flame path for the explosion-proof enclosure 202.

The second set of threads 230 can project axially outwardly from the open end 210 of the lighting guard 206 when the first set of threads 228 is mated with the internal threads 212 of the lighting guard 206. The second set of threads 230 can be configured for mechanically coupling the lighting unit 218 of the structure 200 to the explosion-proof enclosure 203. The explosion-proof enclosure 203 can include a threaded hole configured to mate with the second set of threads 230 to make a flame path for the explosion-proof enclosure 203. The second set of threads 230 can also be used to mate with internal threads 234 of a fastener 232 (e.g., nut) to lock the lighting unit 218 in place such that the lighting unit 218 does not unthread from the explosion-proof enclosure 203.

In certain examples, the explosion-proof enclosure 202 may be mounted to an instrument panel (not shown), although alternatives are possible.

In certain examples, the lighting guard 206 can have a one-piece, monolithic construction and is a one-piece, molded, plastic part, although alternatives are possible. At least a portion of the lighting guard 206 can be transparent for allowing light from the light emitting structure 222 to pass outwardly through the lighting guard 206. At least a portion of the lighting guard 206 can be translucent for allowing light from the light emitting structure 222 to pass outwardly through the lighting guard 206 and for diffusing the light that passes outwardly from the lighting guard 206.

It will be appreciated that the lighting enclosure 202 has a reduced number of parts as compared to prior art lighting enclosures. The lighting guard 206 can have a robust, impact resistant construction that eliminates the need for additional metal guards about its exterior. Further, the lighting guard 206 protects the internal light source, allows light to pass therethrough, and can optionally provide a light diffusing function. Moreover, the internal threads in the light guard 206 provide an integrated flame path and allow for direct connection with the base of the lighting unit so as to minimize the number of parts utilized.

In certain examples, the light transmissive portion can define a viewing window for allowing of inspection within the enclosure. For example, in the case of enclosures such as sealing fittings and sealing glands, the transmissive portions can allow for inspection of internal seal integrity. In the case of enclosures such as cabinet/box style enclosures for enclosing active electrical components, the transmissive portions can allow for visual equipment inspection and inspection of internal moisture levels. The use of plastic light transmissive portions can also assist in reducing the complexity, part count and cost of explosion-proof enclosures. For example, with respect to explosion-proof enclosures for housing lighting, lighting guards having at least portions with plastic light transmissive portions can reduce complexity, part count and cost.

As used herein, electrical components can include wires, switches, light emitters, circuits, capacitors, resistors, controllers, micro-controllers, power circuitry, control circuitry, power circuit protection, motors, pumps, compressors and like structures that carry and/or receive and/or are powered by electricity.

As used herein, light emitters include light generating components such as electroluminescent light sources (e.g., light emitting diodes), incandescent light sources (e.g., incandescent bulbs/lamps), electric discharge-based light sources (e.g., fluorescent lamps) and/or the like.

As used herein explosion-proof enclosures rated for use in hazardous locations are: 1) designed with sufficient structural robustness to withstand internal pressures commensurate with an internal explosion; and 2) equipped with one or more flame paths to permit combustion exhaust gases to escape from the enclosures. A flame path is generally located at the interface between two parts of an enclosure and is designed for the passage and escape of burning gas resulting from an ignition that may take place within the enclosure itself (e.g., as a result of electrical arcing). As the burning gas passes through a flame path, the gas cools before being vented via the flame path into the atmosphere, thereby preventing the burning gas from igniting the volatile atmosphere in the hazardous location. Flame paths thus have length dimensions that are sufficiently long and interstice dimensions that are sufficiently narrow to ensure adequate cooling of the combustion exhaust gases. Flame paths can include threaded flame paths and non-threaded flame paths. Standards for flame paths and explosion-proof enclosures are set forth by IEC/EC 60079-1. Explosion-proof enclosures and flame paths disclosed herein can be in accordance with IEC/EC 60079-1.

As used herein, light transmissive means capable of allowing light to pass therethrough. Transparent materials and translucent materials are each light transmissive.

As used herein, explosion-proof enclosures include explosion-proof housings for enclosing light emitters, explosion-proof sealing fittings for housing sealant and portions of electrical wires that pass therethrough, junction boxes, sealing gland structures, enclosures incorporating control panels, enclosures incorporating lighting panels, enclosures incorporating motor control centers, relay cabinets, switch gear cabinets, and explosion-proof boxes for housing switches, circuitry, power circuitry, control circuitry, power circuit protection, motors, pumps, compressors and/or the like.

It will be appreciated that threaded interfaces disclosed herein between parts of explosion-proof enclosures can be constructed as flame paths. For example, the threaded connections between conduits and sealing fittings can provide flame paths, the threaded connections between plugs and ports of sealing fittings can provide flame paths, the threaded connections provided in sealing glands can provide flame paths, and the threaded connections for securing inspection windows to walls of enclosures can provide flame paths.

Some Selected Characterizations

The following characterizations are indicative of features and techniques according to the present disclosure that relate to: a sealing fitting rated for use in hazardous environments, a conduit system, a transparent viewing arrangement, a method of evaluating a conduit system, a cable gland rated for use in hazardous environments, and an enclosure for use in hazardous environments. In this summary, some selected, summary characterizations of the teachings herein are provided. The list of characterizations is not meant to be exhaustive. 1. A sealing fitting rated for use in hazardous environments characterized by: a main body defining an interior volume, the interior volume being configured to receive a volume of sealant, the main body also including first and second pipe hubs in fluid communication with the interior volume; and at least one sealant filling port in fluid communication with the interior volume; wherein at least a portion of the sealing fitting is transparent for visual inspection inside the interior volume of the sealing fitting. 2. The sealing fitting of characterization 1 wherein: the main body includes a wall, a first end, and a second end opposite the first end that together define the interior volume, the first pipe hub being positioned at the first end and the second pipe hub being positioned at the second end, wherein the main body is cylindrical. 3. The sealing fitting of characterization 2 wherein: the main body defines a longitudinal axis that extends between the first and second ends. 4. The sealing fitting of characterization 1 further comprising: a platform that projects outwardly from the main body, the platform having an angled surface that defines the at least one sealant filling port, the at least one sealant filling port extending through the platform into the interior volume of the sealing fitting. 5. The sealing fitting of characterization 3 further comprising: at least one port plug removably inserted into the at least one sealant filling port. 6. The sealing fitting of characterization 5 wherein: the at least one port plug is aligned at an angle relative to the longitudinal axis. 7. The sealing fitting of characterization 6 wherein: the at least one port plug is aligned at an acute angle relative to the longitudinal axis. 8. The sealing fitting of characterization 1 wherein: the main body is transparent for visual inspection of the volume of sealant inside the interior volume of the sealing fitting. 9. The sealing fitting of characterization 5 wherein: the at least one port plug is transparent for visual inspection of the volume of sealant inside the interior volume of the sealing fitting. 10. The sealing fitting of characterization 1 further comprising: a transparent window located on a portion of the sealing fitting for visual inspection of the volume of sealant inside the interior volume of the sealing fitting. 11. The sealing fitting of characterization 2 further comprising: a first conduit that is connected to the first threaded pipe hub at the first end of the main body of the sealing fitting. 12. The sealing fitting of characterization 2 further comprising: a second conduit that is connected to the second threaded pipe hub at the second end of the main body of the sealing fitting. 13. The sealing fitting of characterization 1 wherein: the visual inspection inside the interior volume of the sealing fitting is by a portable sensing device. 14. The sealing fitting of characterization 1 wherein: the visual inspection inside the interior volume of the sealing fitting is by a naked eye. 15. A sealing fitting rated for use in hazardous environments, the sealing fitting characterized by: a cylindrical main body with first and second ends that together define a body interior, the cylindrical main body defining a longitudinal axis that extends between the first and second ends; a minor port in fluid communication with the body interior, the minor port, in use supplying sealant into the body interior of the sealing fitting; and a first plug removably inserted into the minor port; wherein at least a portion of the sealing fitting is transparent for visual inspection inside the body interior of the sealing fitting. 16. The sealing fitting of characterization 15 wherein: the main body of the sealing fitting is made of transparent material to provide visual inspection inside the body interior of the sealing fitting. 17. The sealing fitting of characterization 15 further comprising: a platform projecting outwardly from the cylindrical main body, the platform having a flat surface that defines a major port, and the platform having an angled surface that defines the minor port, the major and minor ports extending through the platform into the body interior of the sealing fitting, and a second plug removably inserted into the major port; wherein the first and second plugs are made of transparent material to provide visual inspection inside the body interior of the sealing fitting. 18. The sealing fitting of characterization 17 wherein: the minor port is aligned at an acute angle relative to the longitudinal axis, and the major port is aligned perpendicular relative to the longitudinal axis. 19. The sealing fitting of characterization 15 wherein: the first and second ends of the sealing fitting are threaded. 20. The sealing fitting of characterization 15 wherein: at least one cable passes through the body interior of the sealing fitting and the sealant therein. 21. The sealing fitting of characterization 15 wherein: the sealing fitting is a vertical sealing fitting that comprises at least one sealant dam positioned in the body interior and abuts the sealant to prevent passage of sealant into a conduit system. 22. The sealing fitting of characterization 21 wherein: the at least one sealant dam includes a resilient material. 23. The sealing fitting of characterization 22 wherein: the resilient material is packing fiber. 24. The sealing fitting of characterization 15 wherein: the sealing fitting is a horizontal sealing fitting that comprises two sealant dams. 25. The sealing fitting of characterization 15 wherein: the visual inspection inside the body interior of the sealing fitting is by a portable sensing device. 26. The sealing fitting of characterization 15 wherein: the visual inspection inside the body interior of the sealing fitting is by a naked eye. 27. A transparent viewing arrangement for use in a conduit system, the transparent viewing arrangement characterization by: a sealing fitting, the sealing fitting including a cylindrical main body defining a body interior, the body interior being configured to receive a volume of sealant; and a major port in fluid communication with the body interior. 28. The transparent viewing arrangement of characterization 27 further comprising: a platform projecting outwardly from the cylindrical main body, the cylindrical main body including first and second ends, the cylindrical body defining a longitudinal axis that extends between the first and second ends, the platform having a flat surface that defines the major port, and the platform having an angled surface that defines a minor port, the major and minor ports extending through the platform into the body interior of the sealing fitting; a first plug removably inserted into the minor port; and a second plug removably inserted into the major port; wherein the first and second plugs are constructed with a transparent material for visual inspection inside the body interior of the sealing fitting. 29. The transparent viewing arrangement of characterization 27 wherein: the cylindrical main body is constructed with a transparent material for visual inspection inside the body interior of the sealing fitting. 30. The transparent viewing arrangement of characterization 28 wherein: the transparent material is a plastic. 31. The transparent viewing arrangement of characterization 29 wherein: the transparent material is a plastic. 32. The transparent viewing arrangement of characterization 28 wherein: portions of the sealing fitting are constructed with a metallic material. 33. The transparent viewing arrangement of characterization 32 wherein: the first and second plugs are constructed with a transparent material for visual inspection inside the body interior of the sealing fitting. 34. The transparent viewing arrangement of characterization 32 wherein: the cylindrical main body is constructed with a transparent material for visual inspection inside the body interior of the sealing fitting. 35. The transparent viewing arrangement of characterization 28 wherein: the minor port is aligned at an acute angle relative to the longitudinal axis. 36. The transparent viewing arrangement of characterization 28 wherein: the major port is aligned perpendicular relative to the longitudinal axis. 37. The transparent viewing arrangement of characterization 28 wherein: the first and second ends of the sealing fitting are threaded. 38. A sealing fitting rated for use in hazardous environments, the sealing fitting characterized by: a main body with first and second ends that together define a body interior, the main body defining a longitudinal axis that extends between the first and second ends; and a plug removably inserted into a port that extends into the body interior of the sealing fitting; wherein at least a portion of the sealing fitting is transparent for visual inspection inside the body interior of the sealing fitting. 39. The sealing fitting of characterization 38 wherein: the main body of the sealing fitting is made of transparent material to provide visual inspection inside the body interior of the sealing fitting. 40. The sealing fitting of characterization 38 wherein: the plug is made of transparent material to provide visual inspection inside the body interior of the sealing fitting. 41. The sealing fitting of characterization 38 wherein: the first and second ends of the sealing fitting are threaded. 42. The sealing fitting of characterization 38 wherein: the visual inspection inside the body interior of the sealing fitting is by a portable sensing device. 43. The sealing fitting of characterization 38 wherein: the visual inspection inside the body interior of the sealing fitting is by a naked eye. 44. The sealing fitting of characterization 38 wherein: the sealing fitting is adapted for use in an explosion-proof enclosure. 45. A conduit system characterized by: at least one explosion-proof enclosure; at least one sealing fitting in proximity to the explosion-proof enclosure, the sealing fitting comprising: a main body with first and second ends that together define a body interior, the main body defining a longitudinal axis that extends between the first and second ends; a first conduit being connected to the first end of the main body of the sealing fitting; and a second conduit being connected to the second end of the main body of the sealing fitting; wherein at least a portion of the sealing fitting is transparent for visual inspection inside the body interior of the sealing fitting. 46. The conduit system of characterization 45 further comprising: a platform projecting outwardly from the main body, the platform having a flat surface that defines a major port, and the platform having an angled surface that defines a minor port, the major and minor ports extending through the platform into the body interior of the sealing fitting, the major and minor ports, in use supplying sealant into the body interior of the sealing fitting; a first plug removably inserted into the minor port; and a second plug removably inserted into the major port. 47. The conduit system of characterization 46 wherein: the minor port is aligned at an acute angle relative to the longitudinal axis, and the major port is aligned perpendicular relative to the longitudinal axis. 48. The conduit system of characterization 46 wherein: the first and second plugs are constructed with a transparent material for visual inspection inside the body interior of the sealing fitting. 49. The conduit system of characterization 45 wherein: the main body of the sealing fitting is made of transparent material to provide visual inspection inside the body interior of the sealing fitting. 50. The conduit system of characterization 45 further comprising: a transparent window located on a portion of the sealing fitting for visual inspection inside the body interior of the sealing fitting. 51. An enclosure for use in hazardous environments, the enclosure characterized by: a cover and a body, the cover having a cover perimeter flange and the body having a body perimeter flange, the cover perimeter flange and the body perimeter flange engage along a joint when the cover and body are in a closed relationship; and an optical transparent window defined in the body of the enclosure, the optical transparent window having a shape configuration adapted for visually observing an interior of the enclosure. 52. The enclosure of characterization 51 wherein: the shape is convex. 53. The enclosure of characterization 52 wherein: the shape is concave. 54. The enclosure of characterization 53 wherein: the enclosure is an explosion-proof enclosure. 55. A method of evaluating a conduit system, including an explosion-proof enclosure therein, for visually observing structural integrity of sealant within a sealing fitting, the sealing fitting including a main body that defines at least a first port that extends therethrough into an interior of the sealing fitting, at least a first plug removably configured to be inserted into the at least first port: the method characterized by a step of viewing through a transparent portion of the sealing fitting to inspect the interior of the sealing fitting. 56. The method of characterization 55 wherein: the step of viewing is by a naked eye. 57. The method of characterization 55 wherein: the step of viewing is through the at least first plug. 58. The method of characterization 55 wherein: the step of viewing is through the main body of the sealing fitting. 59. The method of characterization 55 wherein: the step of viewing through a transparent window located on the sealing fitting. 60. The method according to characterization 55 wherein: the step of viewing is by a portable sensing device. 61. The method according to characterization 60 wherein: the portable sensing device comprises one or more of optical light sensors, infrared sensors, ultraviolet sensors, microwave sensors, radar sensors, acoustic sensors, static or dynamic fluid or vapor pressure sensors, chemical indicator sensors, and ultrasound sensors to evaluate the integrity of the sealant located within the interior of the sealing fitting. 62. A cable gland rated for use in hazardous environments, the cable gland characterized by: a main body defining an internal bore for receiving a cable; a plug fitted inside a portion of the internal bore of the main body, the plug including a compound chamber, the compound chamber being configured to receive a volume of sealant; a first transparent window positioned in the main body; and a second transparent window positioned in the plug; wherein the first and second transparent windows are aligned for allowing visual inspection inside the compound chamber of the cable gland.

The various embodiments described above are provided by way of illustration only and should not be construed to limit the claims attached hereto. Those skilled in the art will readily recognize various modifications and changes that may be made without following the example embodiments and applications illustrated and described herein, and without departing from the true spirit and scope of the following claims.

What is claimed is:

1. A structure for housing an electrical component, the structure comprising:
    an explosion-proof enclosure rated for use in a hazardous location, the explosion-proof enclosure including at least one flame path, the explosion-proof enclosure also including at least a portion having a plastic construction that is light transmissive;
    wherein the portion of the explosion-proof enclosure including the plastic construction that is light transmissive is provided as at least part of a sealing fitting having first and second pipe hubs and a sealant injection port.

2. The structure of claim 1, wherein the portion of the explosion-proof enclosure including the plastic construction that is light transmissive is provided as at least part of a plug that mounts within the sealant injection port.

3. The structure of claim 1, wherein the portion of the explosion-proof enclosure including the plastic construction that is light transmissive is provided as at least part of a main body of the sealing fitting.

4. The structure of claim 1, wherein the portion of the explosion-proof enclosure including the plastic construction that is light transmissive provides a viewing location for inspecting inside the explosion-proof enclosure.

5. The structure of claim 4, wherein the explosion-proof enclosure is configured for enclosing active electrical equipment.

6. The structure of claim 5, wherein an inspection window is secured to a wall of the explosion-proof enclosure by a direct threaded connection.

7. A method of evaluating a conduit system, including an explosion-proof enclosure therein, for visually observing structural integrity of sealant within a sealing fitting, the sealing fitting including a main body that defines at least a first port that extends therethrough into an interior of the sealing fitting, at least a first plug removably configured to be inserted into the at least first port: the method including a step of viewing through a transparent portion of the sealing fitting to inspect the interior of the sealing fitting.

8. The method of claim 7, wherein the step of viewing is by a naked eye.

9. The method of claim 7, wherein the step of viewing is through the at least first plug.

10. The method of claim 7, wherein the step of viewing is through the main body of the sealing fitting.

11. A cable gland rated for use in hazardous environments, the cable gland comprising:
    a main body defining an internal bore for receiving a cable;

a plug fitted inside a portion of the internal bore of the main body, the plug including a compound chamber, the compound chamber being configured to receive a volume of sealant;

a first transparent window positioned in the main body; and a second transparent window positioned in the plug;

wherein the first and second transparent windows are aligned for allowing visual inspection inside the compound chamber of the cable gland.

12. A structure for housing an electrical component, the structure comprising:

an explosion-proof enclosure rated for use in a hazardous location, the explosion-proof enclosure including at least one flame path, the explosion-proof enclosure also including at least a portion having a plastic construction that is light transmissive;

wherein the portion of the explosion-proof enclosure including the plastic construction that is light transmissive is provided as at least part of a lighting guard defining an interior enclosure volume in which a light emitter is housed, the lighting guard having a one-piece, unitary construction with a closed end positioned opposite from an open end, the lighting guard including internal threads adjacent the open end that provide the explosion-proof enclosure with the at least one flame path.

13. The structure of claim 12, wherein the light emitter includes at least one light emitting diode.

14. The structure of claim 12, wherein the light emitter includes a lighting unit having a base and a light emitting structure carried with the base, wherein the base includes external threads, wherein electrical wires are routed through the base to the light emitting structure, wherein the internal threads of the lighting guard mate with the external threads of the base to secure the base within the lighting guard with the base enclosing the open end of the lighting guard, and the light emitting structure of the lighting unit is positioned within the interior enclosure volume of the lighting guard between the base and the closed end of the lighting guard, and wherein the at least one flame path is a threaded flame path defined between the external threads of the base and the internal threads of the lighting guard.

15. The structure of claim 14, wherein the lighting guard is a one-piece, plastic part.

16. The structure of claim 14, wherein at least a portion of the lighting guard is transparent for allowing light from the light emitting structure to pass outwardly through the lighting guard.

17. The structure of claim 14, wherein at least a portion of the lighting guard is translucent for allowing light from the light emitting structure to pass outwardly through the lighting guard.

18. The structure of claim 14, wherein the external threads of the base include a first set of threads and a second set of threads, wherein the second set of threads has a smaller diameter than the first set of threads, wherein the first set of threads mate with the internal threads of the lighting guard, wherein the second set of threads project axially outwardly from the open end of the lighting guard when the first set of threads is mated with the internal threads of the lighting guard, and wherein the second set of threads is configured for mechanically coupling the structure to another explosion-proof enclosure.

19. The structure of claim 12, wherein the lighting guard includes a polymer that provides structural impact resistance such that no additional structure is needed to guard the light emitter from impact damage.

* * * * *